US011078073B2

(12) United States Patent
Yerushalmi et al.

(10) Patent No.: US 11,078,073 B2
(45) Date of Patent: Aug. 3, 2021

(54) SELF-PROCESSING SYNTHESIS OF HYBRID NANOSTRUCTURES

(71) Applicant: Yissum Research Development Company of the Hebrew University of Jerusalem Ltd., Jerusalem (IL)

(72) Inventors: Roie Yerushalmi, Kfar Warburg (IL); Yossef Paltiel, Maskeret Batya (IL); Ori Pinchas-Hazut, Jerusalem (IL); Sharon Waichman, Ganey Tikva (IL); Amir Ziv, Kefar Saba (IL); Shira Yochelis, Ness Ziona (IL)

(73) Assignee: Yissum Research Development Company of the Hebrew University of Jerusalem Ltd., Jerusalem (IL)

( * ) Notice: Subject to any disclaimer, the term of this patent is extended or adjusted under 35 U.S.C. 154(b) by 485 days.

(21) Appl. No.: 15/551,408

(22) PCT Filed: Apr. 21, 2016

(86) PCT No.: PCT/IB2016/052276
§ 371 (c)(1),
(2) Date: Aug. 16, 2017

(87) PCT Pub. No.: WO2016/135713
PCT Pub. Date: Sep. 1, 2016

(65) Prior Publication Data
US 2018/0065842 A1 Mar. 8, 2018

Related U.S. Application Data

(60) Provisional application No. 62/119,445, filed on Feb. 23, 2015, provisional application No. 62/312,063, filed on Mar. 23, 2016.

(51) Int. Cl.
*B81C 1/00* (2006.01)
*B82B 1/00* (2006.01)
(Continued)

(52) U.S. Cl.
CPC .......... *B81C 1/00031* (2013.01); *B82B 1/001* (2013.01); *B82Y 30/00* (2013.01); *B82Y 35/00* (2013.01); *B81B 2203/0361* (2013.01)

(58) Field of Classification Search
CPC ..... B81C 1/00031; B82B 1/001; B82Y 30/00; B82Y 35/00; B81B 2203/0361
See application file for complete search history.

(56) References Cited

U.S. PATENT DOCUMENTS

2008/0081388 A1* 4/2008 Yasseri ................. B82Y 10/00
438/22
2008/0088899 A1* 4/2008 Kamins ................ B81B 3/0021
359/196.1
(Continued)

OTHER PUBLICATIONS

Colfen et al., "Higher-Order Organization by Mesoscale Self-Assembly and Transformation of Hybrid Nanostructures", Angew. Chem. Int. Ed., vol. 42, pp. 2350-2365, (2003).
(Continued)

*Primary Examiner* — Katherine A Bareford
*Assistant Examiner* — Christina D McClure
(74) *Attorney, Agent, or Firm* — Vorys, Sater, Seymour and Pease LLP; Anthony Venturino

(57) ABSTRACT

Provided is a self-processing synthesis of hybrid nanostructures, novel nanostructures and uses thereof in the construction of electronic and optoelectronic devices.

11 Claims, 17 Drawing Sheets

(51) Int. Cl.
*B82Y 30/00* (2011.01)
*B82Y 35/00* (2011.01)

(56) References Cited

U.S. PATENT DOCUMENTS

| | | | |
|---|---|---|---|
| 2008/0266556 A1* | 10/2008 | Kamins | B82Y 20/00 356/301 |
| 2010/0215915 A1* | 8/2010 | Norton | B01J 23/52 428/174 |
| 2016/0079452 A1* | 3/2016 | Seok | H01L 31/02366 257/436 |

OTHER PUBLICATIONS

Costi et al., "Colloidal Hybrid Nanostructures: A New Type of Functional Materials", Angew. Chem. Int. Ed., vol. 49, pp. 4878-4897, (2010).

Fischer et al., "Metal Oxide/Polymer Hybrid Nanoparticles with Versatile Functionality Prepared by Controlled Surface Crystallization", Adv. Funct. Mater., vol. 23, pp. 451-466, (2013).

Jia et al., "Couples of colloidal semiconductor nanorods formed by self-limited assembly", Nature Materials, vol. 13, pp. 301-307, (2014).

Kurppa et al., "Controlled Hybrid Nanostructures through Protein-Mediated Noncovalent Functionalization of Carbon Nanotubes", Angew. Chem. Int. Ed., vol. 46, pp. 6446-6449, (2007).

Loget et al., "Bulk synthesis of Janus objects and asymmetric patchy particles", J. Mater. Chem., vol. 22, pp. 15457-15474, (2012).

Mokari et al., "Selective Growth of Metal Tips onto Semiconductor Quantum Rods and Tetrapods", Science, vol. 304, pp. 1787-1790, (2004).

Mokari et al., "Synthesis and characterization of hybrid nanostructures", Nano Reviews vol. 2, pp. 5983 (1-9), (2011).

Reddy et al., "Hybrid Nanostructures for Energy Storage Applications", Adv. Mater., vol. 24, pp. 5045-5064, (2012).

Walther et al., "Janus Particles: Synthesis, Self-Assembly, Physical Properties, and Applications", Chem. Rev., vol. 113, pp. 5194-5261, (2013).

Xu et al., "Controlled Soft-Template Synthesis of Ultrathin C@FeS Nanosheets with High-Li-Storage Performance", ACS Nano, vol. 6, No. 6, pp. 4713-4721, (2012).

Zeeshan et al., "Structural and magnetic characterization of batch-fabricated nickel encapsulated multi-walled carbon nanotubes", Nanotechnology, vol. 22, pp. 275713 (1-11), (2011).

McGuire, G. E., Semiconductor Materials and Process Technology Handbook: For Very Large Scale Integration (VLSI) and Ultra Large Scale Integration (ULSI). (Noyes Publications, Park Ridge, N.J., 1988).

Koch, C. C., Nanostructured Materials Processing, Properties, and Applications. (William Andrew Pub., Norwich, N. Y., 2007).

* cited by examiner

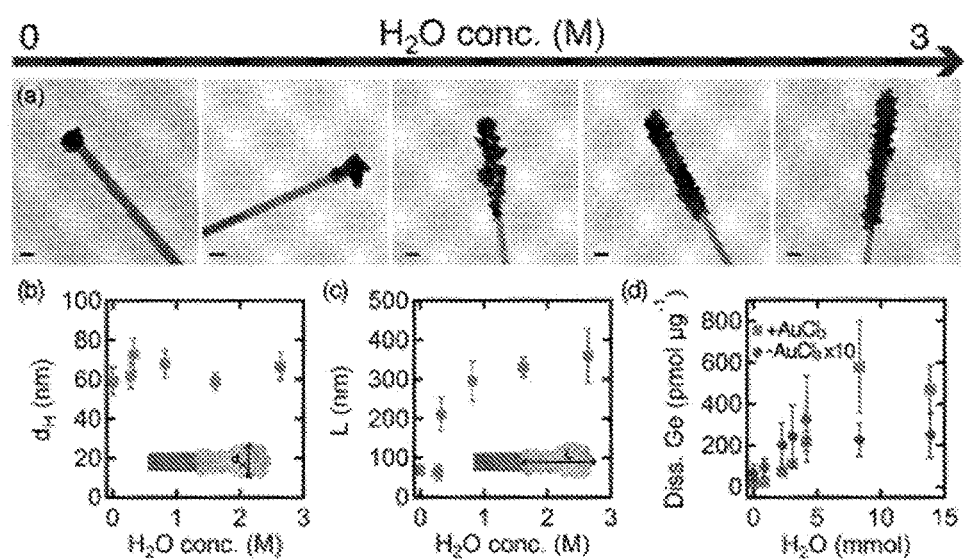
Figures 3A-D (a)

SELF-PROCESSING SYNTHESIS OF HYBRID NANOSTRUCTURES

TECHNOLOGICAL FIELD

The invention generally concerns a self-processing synthesis of hybrid nanostructures, novel nanostructures and uses thereof.

BACKGROUND

Nanometer-scale systems play central roles in numerous fields related to material science and are applied in various ways due to their unique chemical and physical properties. Accordingly, the controlled synthesis of building blocks featuring nanometer-scale structural motifs has resulted in much technological interest and research.

The construction of nanometer-scale components mainly relies on two complementary approaches: top-down techniques and bottom-up synthesis. Typically, top-down techniques involve a pre-defined processing sequence with an explicit blueprint of patterns and processing steps, which are applied to a macroscopic substrate and result in the desired structure, dimensions and composition [1]. In contrast, bottom-up synthesis mainly relies on the meticulous design of physical and chemical interactions among different components, such as molecules and particles that undergo assembly or self-assembly processes and yield more complex structures [2]. In bottom-up synthesis, the information required for the assembly process is embedded in the system components by designing their physical interactions and chemical reactivity. Each of these approaches has advantages and disadvantages. For example, multi-step processing, high reproducibility, and ease of design are hallmarks of top-down fabrication, and bottom-up synthesis is better for parallel processing, diversity, and scalability.

Bottom-up and top-down approaches are often used to construct nanosystems that are comprised of two or more components with distinct chemical compositions, structural domains and physical properties, which are commonly referred to as hybrid nanostructures (HNS) [3-7]. Overall, HNS are central for designing novel materials with desired optical, mechanical, and electronic properties at the nanometer scale by introducing architectures with programmed compositions and heterogeneous shapes. It is important to combine several materials and morphologies within the same nanostructure to attain new and synergistic functionalities because properties at the nanoscale depend on the composition, size, and dimensionality of the nanostructures [4]. Such structures can be prepared using a large spectrum of approaches, including template-assisted synthesis, colloid surface chemistry, and protein assembly [8-12].

However, these approaches often suffer from limited and generally complex control over the synthesis parameters of various system materials; thus, their synthesis development is typically time and cost intensive.

BACKGROUND ART

[1] McGuire, G. E. *Semiconductor Materials and Process Technology Handbook: For Very Large Scale Integration (VLSI) and Ultra Large Scale Integration (ULSI)*. (Noyes Publications, Park Ridge, N.J., 1988).

[2] Koch, C. C. *Nanostructured Materials Processing, Properties, and Applications*. (William Andrew Pub., Norwich, N.Y., 2007).

[3] Cölfen, H. & Mann, S. Higher-order organization by mesoscale self-assembly and transformation of hybrid nanostructures. *Angew. Chem. Int. Ed. Engl.* 42, 2350-2365 (2003).

[4] Costi, R., Saunders, A. E. & Banin, U. Colloidal hybrid nanostructures: a new type of functional materials. *Angew. Chem. Int. Ed. Engl.* 49, 4878-4897 (2010).

[5] Reddy, A. L. M., Gowda, S. R., Shaijumon, M. M. & Ajayan, P. M. Hybrid nanostructures for energy storage applications. *Adv. Mater.* 24, 5045-5064 (2012).

[6] Walther, A. & Müller, A. H. E. Janus particles: synthesis, self-assembly, physical properties, and applications. *Chem. Rev.* 113, 5194-5261 (2013).

[7] Loget, G. & Kuhn, A. Bulk synthesis of janus objects and asymmetric patchy particles. *J. Mater. Chem.* 22, 15457-15474 (2012).

[8] Zeeshan, M. A. et al. Structural and magnetic characterization of batch-fabricated nickel encapsulated multiwalled carbon nanotubes. *Nanotechnology* 22, 275713 (2011).

[9] Jia, G. et al. Couples of colloidal semiconductor nanorods formed by self-limited assembly. *Nat. Mater.* 13, 301-307 (2014).

[10] Kurppa, K. et al. Controlled hybrid nanostructures through protein-mediated noncovalent functionalization of carbon nanotubes. *Angew. Chemie* 119, 6566-6569 (2007).

[11] Fischer, V., Lieberwirth, I., Jakob, G., Landfester, K. & Muñoz-Espí, R. Metal oxide/polymer hybrid nanoparticles with versatile functionality prepared by controlled surface crystallization. *Adv. Funct. Mater.* 23, 451-466 (2013).

[12] Xu, C. et al. Controlled soft-template synthesis of ultrathin C@FeS nanosheets with high-Li-storage performance ACS Nano 6, 4713-4721 (2012).

[13] Mokari T. Synthesis and characterization of hybrid nanostructures. *NanoReviews* 2, 5983 (2011).

GENERAL DESCRIPTION

To address the disadvantages of processes of the art, the inventors of the technology disclosed herein have developed a novel synthetic method for attaining hybrid nanostructures (HNS) of metals and semiconductor materials. The methodology of the present invention, herein referred to as "self-processing synthesis", SP, can be used to synthesize a variety of HNSs in one step by triggering a programmable cascade of events that is executed autonomously, without needing external stimulus or multi-step manipulations. The structures are formed using a self-propagating sequence that unlike other hybrid systems such as those described, for example in [13], involves etching, deposition, modification and self-termination of the transformations, all in one continuous wet process. The self-processing synthesis does not involve nor requires isolation, purification and identification of intermediate structures, rather proceeds in a continuous manner that nevertheless may be pre-defined and controllable.

The synthetic strategy takes advantage of the inherent asymmetry exhibited by a metal-semiconductor junction, such as that present in nanowires prepared by metal-catalyzed chemical vapor deposition (CVD) methods. Where nanowires are concenrmed, the metal-semiconductor junction is used for activating the self-processing to a localized region at the tip area using a wet-chemistry approach. The hybrid nanostructures obtained for metals such as the coinage metals: Cu, Ag, and Au, resemble the morphology of grass flowers. Thus, structures formed according to the SP synthesis are termed herein "nano floret" (NF) hybrid nanostructures. These nanostructures consist of a high aspect ratio nanowire (NW) with a metallic nanoshell cap.

However, the novel and generic approach may be utilized not only in the construction of nanowire hybrid nanostructures but also in the construction of, e.g., 2-dimensional and planar 3-dimensional nanostructures.

As the results provided herein indicate, the SP synthesis involves distinct processing steps including localized oxide etch around a metal-semiconductor junction, metal deposition, and process termination, resulting in growth of a metallic region onto and surrounding the metal-semiconductor junction. The mechanism of the process of the invention was demonstrated in the synthesis of an exemplary Au-nano-floret (Au—NF) hybrid nanostructure, based on SiGe alloy nanowires (SiGe NWs). Despite the fact that Au—SiGe NWs were used, growth of a metallic region of a metal different from Au was made possible, onto and surrounding the Au-SiGe junction.

The process is initiated by mild etching of an oxide layer which may be a native oxide on the semiconductor material or an oxide layer intentionally formed thereon, using an etchant such as water, that removes a region of the oxide layer at the metal (e.g., Au)-semiconductor junction or vicinity thereof. Catalytic metal deposition occurs at the metal (e.g., Au) catalyst edge, and metal deposition subsequently occurs at the exposed semiconductor surface, namely at the etched region. Without wising to be bound by theory, the semiconductor oxide layer is locally removed in the presence of the etchant, e.g., water, by metal-assisted chemical etching due to the semiconductor-metal junction that is present. Galvanic redox reactions at the exposed semiconductor region result in metal cation reduction and nucleation. Metal clusters grow at the metal nuclei, assisted by the catalytic redox reactions driven by a reducing agent. The process stops when the exposed semiconductor region is completely covered with a metal layer, probably involving surface poisoning with metal—H species at the anaerobic conditions employed in the synthesis, resulting in a self-limiting process.

Thus, the process is triggered or initiated by removal of a oxide material at the vicinity of the metal-semiconductor junction, evolving a programmable cascade of events that result in the controllable growth of a metallic region around the metal-semiconductor junction. The metal grown on said junction may or may not be the same as the metal of the metal-semiconductor junction.

In a first aspect, the invention provides a process for patterning a semiconductor material at a metal-semiconductor interface, a region of said interface having a layer of a semiconductor oxide (namely an oxide which is formed on the semiconductor material, not necessarily an oxide of an atom of the semiconductor material), the process comprising patterning said region of a semiconductor oxide with a processing solution comprising at least one etchant and at least one metal source, and causing deposition of at least one metal from said at least one metal source at said patterned region.

In some embodiments, the oxide formed on the semiconductor material is an oxide of at least one metal atom which is not an atom of the semiconductor material. IN such cases, the oxide film or layer of at least one metal is intentionally formed as a protective layer on top of the semiconductor material for the purpose of protecting the semiconductor material or for the purpose of enabling patterning steps according to the invention.

In some embodiments, the at least one etchant is selected to cause exposure of the semiconductor material (namely removal of the oxide material, as defined) to deposition thereonto of said at least one metal.

In some embodiments, the processing solution comprises at least one etchant, at least one metal source and optionally at least one reducing agent.

In some embodiments, the oxide present on the semiconductor material may be a native oxide layer or an oxide of the semiconductor material which is intentionally formed (synthetically derived) on the semiconductor surface. As used herein, the term "patterning" refers to forming an oxide-free region(s) on the semiconductor material. In other words, the process of the invention permits selective removal of an oxide material from the semiconductor surface, yielding an oxide-free semiconductor material onto which metal deposition can take place; thus permitting patterning or decorating of the semiconductor region (from which oxide material has been removed, or etched) with the metal.

The invention further provides a process for forming a metal region at a metal-semiconductor junction, the process comprising causing material removal (etching, patterning) from a region of an oxide layer present at the vicinity of the metal-semiconductor junction, to thereby expose a region of an underlining semiconductor surface, and subsequent metal cluster growth at the semiconductor surface and/or at the metal semiconductor interface.

The invention further provides a bottom-up process for forming a metal region on a semiconductor surface, the process comprising selective metal deposition at a metal-semiconductor interface under reductive conditions.

The invention further provides a process for forming a metal region at a metal-semiconductor junction, the process comprising
  contacting a semiconductor surface decorated with at least one first metal with at least one metal source of a second metal (i.e., of a metal which may or may not be the same as the metal decorating the semiconductor surface), at least one reducing agent and at least one etchant, under conditions causing selective etching of an oxide present on the semiconductor surface at the vicinity of the first metal, and subsequent reduction of the at least one metal source to at least one second metal and surface deposition of the at least one second metal at said etched region.

The invention further provides a process comprising contacting a semiconductor material comprising at least one metal-semiconductor junction of a first metal and a semiconductor material, the junction being surrounded by an oxide layer of said semiconductor material, with at least one metal source of a second metal (i.e., of a metal which may or may not be the same as the metal of the metal-semiconductor junction), at least one reducing agent and at least one etchant, e.g., water, under conditions permitting etching of at least a region of said native oxide and surface deposition of the second metal at said etched region.

The invention further provides a self-processing method for forming a metallic region at a metal-semiconductor junction present on a substrate, the method comprising contacting said substrate with at least one metal source (i.e., of a metal which may or may not be the same as the metal of the metal-semiconductor junction), at least one reducing agent and water, under conditions permitting autonomous etching of at least a region of an oxide layer present at the vicinity of the junction and surface deposition of a metal at said etched region.

The "metal-semiconductor junction" is a region on the semiconductor material surface which is in direct contact with a metal. The junction may be in the form of a single metal region on the surface of the semiconductor material or may in the form of a plurality of such regions. Thus, the metallic regions may be considered as decorating a semiconductor surface, in a random or predefined form, size and density. The form and size of the metal region on the semiconductor material surface may vary based on the type of the device and the intended purpose.

Where the semiconductor surface is flat or substantially two-dimensional, the metal region forming the metal-semiconductor junction may be a single region on the flat surface or multiple spaced apart regions, which density on the surface may be homogenous, inhomogeneous, predefined or random. Where the semiconductor surface is a three-dimensional surface, the junction may be formed at any region of the three-dimensional structure. In some embodiments, the semiconductor is in the form of an elongated or star-like three-dimensional structure and the metal junction is present on one or more ends (or tips or edges) of said elongated or star-like structure.

The metal-semiconductor junction may be formed by any one method known in the art. Such may include molecular beam epitaxy (MBE), pulsed laser deposition (PLD), thermal evaporation, electron-beam evaporation, atomic layer deposition (ALD), and chemical vapor deposition (CVD).

The metal of the metal-semiconductor junction may be any metal provided that at the metal-semiconductor interface local changes in the electronic structure are formed that is then used for local changes in reactivity. In some embodiments, the metal of the metal-semiconductor junction is selected amongst transition metals selected from Groups IIIB, IVB, VB, VIB, VIIB, VIIIB, IB and IIB of block d the Periodic Table, as further defined hereinbelow. In some embodiments, the metal is gold.

Irrespective of the metal of the junction, the process of the invention permits growth of a metal region of a metal different from the metal of the junction onto and/or at the vicinity of the junction. In some embodiments, the metal region comprises or consists a metal which is the same as the metal of the junction. In other embodiments, the metal region comprises or consists a metal which is different from the metal of the junction.

The metal grown onto or at the vicinity of the junction is obtained from at least one metal source which is contacted with the semiconductor junction. When the semiconductor native oxide layer is locally removed in the presence of the etchant, by metal-assisted chemical etching, galvanic redox reactions at the exposed semiconductor region result in metal cation reduction and nucleation. Metal clusters grow at the nuclei assisted by the catalytic redox reactions driven by the reducing agent. Thus, the metal is first produced by reduction of the metal source by the exposed semiconductor material and assisted by the reducing agent. As such, the metal and metal source may be selected irrespective of the metal of the metal-semiconductor junction. In some embodiments, the metal is selected amongst transition metals selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Ag, Mn, Co, Cd, Hf, Ta, Re, Os, Ir, Pd, Pt and Hg.

In some embodiments, the metal is Cu, Au or Ag.

In some embodiments, the metal of the metal-semiconductor junction is Au and the metal grown onto or at the vicinity of the junction is selected from Cu, Au and Ag. In some embodiments, the metal of the metal-semiconductor junction is Au and the metal grown onto or at the vicinity of the junction is Cu. In some embodiments, the metal of the metal-semiconductor junction is Au and the metal grown onto or at the vicinity of the junction is Au. In some embodiments, the metal of the metal-semiconductor junction is Au and the metal grown onto or at the vicinity of the junction is Ag.

The semiconductor material may be any semiconductor material typically used in electronic or optoelectronic devices. Typically, where the process of the invention is applied onto an existing metal-decorated semiconductor material, the process features and conditions may be engineered and selected to meet the limitations of the semiconductor material. In other cases, where a device is constructed bottom-up, and the semiconductor material may be selected to meet the requirements of the device or the process for its manufacture, the semiconductor material may be chosen from a variety of elements of the periodic table to form semiconductor materials or alloys that suite the particular application. Generally speaking, such semiconductor materials may be selected from elements of Group I-VII, Group II-VI, Group III-V, Group IV-VI, Group and Group IV semiconductors and combinations thereof.

In some embodiments, the semiconductor material is a Group I-VII semiconductor, selected optionally from CuCl, CuBr, CuI, AgCl, AgBr, AgI and the like.

In other embodiments, the semiconductor material is a Group II-VI material being selected, in a non-limiting fashion from CdSe, CdS, CdTe, ZnSe, ZnS, ZnTe, HgS, HgSe, HgTe, CdZnSe, ZnO and any combination thereof.

In further embodiments, Group III-V semiconductor materials may be selected. In such cases, the semiconductor materials may be any one or more of InAs, InP, InN, GaN, InSb, InAsP, InGaAs, GaAs, GaP, GaSb, AlP, AN, AlAs, AlSb, CdSeTe, ZnCdSe and any combination thereof.

In additional embodiments, the semiconductor material is selected from Group IV-VI, the material being optionally selected from PbSe, PbTe, PbS, PbSnTe, $Tl_2SnTe_5$ and any combination thereof.

In other embodiments, the material is or comprises an element of Group IV. In some embodiments, the material is selected from C, Si, Ge, Sn and Pb. In some embodiments, the semiconductor material comprises at least one of Si and Ge. In further embodiments, the semiconductor material is SiGe.

In some embodiments, the semiconductor material is a surface region or bulk material of a three-dimensional object. The three-dimensional object may be any symmetric or asymmetric object or device. In some embodiments, the object is a feature of an electronic or optoelectronic device, e.g., a surface of the device, an electrode, etc.

In some embodiments, the object is a semiconductor wire, e.g., a nanowire, having at least one of the wire dimensions in the nanoscale, and may be in any length. The nanowire may be characterized by a length in the micrometer scale and a thickness in the nanometer scale. Thus, a nanowire may have an aspect ratio of between 1,000 and 1,000,000.

In some embodiments, the length of the nanowire is between 900 nm and 1,000 microns. In some embodiments, the nanowire length is between 900 and 1,000 nm, between 900 and 1,500 nm, between 900 and 2,000 nm, between 900 and 2,500 nm, between 900 and 3,000 nm, between 900 and 3,500 nm, between 900 and 4,000 nm, between 900 and 4,500 nm, between 900 and 5,000 nm, between 900 and 5,500 nm, between 900 and 6,000 nm, between 900 and 6,500 nm, between 900 and 7,000 nm, between 900 and 7,500 nm, between 900 and 8,000 nm, between 900 and 8,500 nm, between 900 and 9,000 nm, between 900 and 9,500 nm or between 900 and 10,000 nm.

In some embodiments, the nanowire length is between 10 microns and 1,000 microns, between 10 microns and 950 microns, between 10 microns and 900 microns, between 10 microns and 850 microns, between 10 microns and 800 microns, between 10 microns and 750 microns, between 10 microns and 700 microns, between 10 microns and 650 microns, between 10 microns and 600 microns, between 10 microns and 550 microns, between 10 microns and 500 microns, between 10 microns and 450 microns, between 10 microns and 400 microns, between 10 microns and 350 microns, between 10 microns and 300 microns, between 10 microns and 250 microns, between 10 microns and 200 microns, between 10 microns and 150 microns, between 10 microns and 100 microns, between 10 microns and 90 microns, between 10 microns and 80 microns, between 10 microns and 70 microns, between 10 microns and 60 microns, or between 10 microns and 50 microns.

In some embodiments, the nanowire length is between 100 and 1,000 microns, between 100 and 950 microns, between 100 and 900 microns, between 100 and 850 microns, between 100 and 700 microns, between 100 and 650 microns, between 100 and 600 microns, between 100 and 550 microns or between 100 and 500 microns.

In some embodiments, the nanowire diameter, thickness, is between 1 nm and 100 nm. In some embodiments, the diameter is between 1 and 90 nm, between 1 and 80 nm, between 1 and 70 nm, between 1 and 60 nm, between 1 and 50 nm, between 1 and 40 nm, between 1 and 30 nm, between 1 and 20 nm or between 1 and 10 nm.

In some embodiments, the nanowire diameter, thickness, is between 10 nm and 100 nm, between 10 and 90 nm, between 10 and 80 nm, between 10 and 70 nm, between 10 and 60 nm, between 10 and 50 nm, between 10 and 40 nm, between 10 and 30 nm, between 10 and 20 nm, between 20 nm and 100 nm, between 20 and 90 nm, between 20 and 80 nm, between 20 and 70 nm, between 20 and 60 nm, between 20 and 50 nm, between 20 and 40 nm, between 20 and 30 nm, between 30 and 100 nm, between 30 nm and 90 nm, between 30 and 80 nm, between 30 and 70 nm, between 30 and 60 nm, between 30 and 50 nm, between 30 and 40 nm, between 40 and 100 nm, between 40 and 90 nm, between 40 and 80 nm, between 50 nm and 70 nm, between 50 and 60 nm, between 60 and 100 nm, between 60 and 90 nm, between 60 and 80 nm, between 60 and 70 nm, between 70 and 100 nm, between 70 and 90 nm, between 70 and 80 nm, between 80 and 100 nm, between 80 and 90 nm or between 90 and 100 nm.

In some embodiments, the semiconductor wire comprises a wire core of one material, which may or may not be a semiconductor material and an external coat of a second material, which may or may not be a semiconductor material and which may or may not be the same as the core material. In some embodiments, the semiconductor material is made of a single material.

In some embodiments, the semiconductor nanowire is a core/shell structure comprising a core wire and one or more shells coating the core wire.

The semiconductor nanowire may have one or more metallic regions in contact with the semiconductor material making up the surface of the nanowire; namely, the nanowires have one or more metal-semiconductor junctions as herein defined. In some embodiments, the metallic regions are at the ends, tips or edges of the nanowire (at one or both ends), thus being metal caps at the nanowire end(s). As demonstrated herein, the metal caps may be achieved by any one method known in the art, such as molecular beam epitaxy (MBE), pulsed laser deposition (PLD) and chemical vapor deposition (CVD). The metal cap may be formed during the production process of the nanowire, or may be formed, as a separate step, on the nanowire after its manufacture.

In some embodiments, the metal cap is gold.

The metal which is grown onto or at the vicinity of the nanowire-metal cap junction may be selected amongst transition metals selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Ag, Mn, Co, Cd, Hf, Ta, Re, Os, Ir, Pd, Pt and Hg.

In some embodiments, the metal is Cu, Au or Ag.

In some embodiments, the metal cap is Au and the metal grown is selected from Cu, Au and Ag. In some embodiments, the metal cap is Au and the metal grown is Cu. In some embodiments, the metal cap is Au and the metal grown is Au. In some embodiments, the metal cap is Au and the metal grown is Ag.

The nanowire semiconductor material may be selected from elements of Group I-VII, Group II-VI, Group III-V, Group IV-VI, Group and Group IV semiconductors and combinations thereof.

In some embodiments, the nanowire semiconductor material is a Group I-VII semiconductor, selected from CuCl, CuBr, CuI, AgCl, AgBr, AgI and the like.

In other embodiments, the semiconductor material is a Group II-VI material selected from CdSe, CdS, CdTe, ZnSe, ZnS, ZnTe, HgS, HgSe, HgTe, CdZnSe, ZnO and any combination thereof.

In further embodiments, Group III-V material are selected from InAs, InP, InN, GaN, InSb, InAsP, InGaAs, GaAs, GaP, GaSb, AlP, AlN, AlAs, AlSb, CdSeTe, ZnCdSe and any combination thereof.

In additional embodiments, the nanowire semiconductor material is selected from Group IV-VI, the material being selected from PbSe, PbTe, PbS, PbSnTe, Tl$_2$SnTe$_5$ and any combination thereof.

In other embodiments, the nanowire material is or comprises an element of Group IV. In some embodiments, the nanowire material is selected from C, Si, Ge, Sn and Pb. In some embodiments, the nanowire material comprises at least one of Si and Ge. In further embodiments, the nanowire material is SiGe.

Where the semiconductor material is in the form of a nanowire, the hybrid nanostructure obtained by the process of the invention, comprising the semiconductor nanowire and the metal growth at one of its ends, resemble grass flowers or "florets" as presented in FIG. 1 (inspired by the use of water for initiating the synthesis).

As noted hereinabove, the synthetic strategy takes advantage of the inherent asymmetry of the initial structure, e.g., the nanowire, having a semiconductor region and a metal region. In the case of such materials obtained by, e.g., CVD processes and vapor-liquid-solid (VLS) synthesis mechanism, the metal region may be a remnant of the metal-seed derived deposition mechanism. The process of the invention which includes etching and deposition steps, derived by the presence of at least one etchant material (e.g., water), the semiconductor composition, the presence of at least one reducing agent, the selection of a metal source to be deposited as metal on the junction, and optionally the presence of surfactants and/or ligands for controlling grain size, confine the self-processing synthesis to a well defined region of the structure with self-limiting reactions. The presence of the etchant, a reducing agent and the metal source allow for structural control that is typically associated with top-down fabrication capabilities and not with bottom-up fabrication processes, such as the process of the invention.

Thus, the presence and concentration of each of the etchant, reducing agent and metal source govern the progression of the self-processing synthesis. The respective amounts of each of these components should be effective to achieve selective etching of a (native) oxide layer at the vicinity of the metal-semiconductor junction, reduction of the metal source and metal deposition onto the etched region.

The metal source is any metal-containing material which provides a metal to be deposited on an etched region of the semiconductor according to the invention.

In some embodiments, the metal in the metal source is in a reducible form; namely in the form which may be reduced to a metal of zero valance. Thus, in some embodiments, the metal may be in the form of a metal cation. In some embodiments, the metal source is selected from the following, wherein "M" represents the metal atom:

- acetates (the group $CH_3COO^-$, abbreviated $AcO^-$) selected from AcOM, $AcO_2M$, $AcO_3M$, and $AcO_4M$;
- acetates hydrates (the group $CH_3COO^-$, abbreviated $AcO^-$) selected from $AcOM \cdot xH_2O$, $AcO_2M \cdot xH_2O$, $AcO_3M \cdot xH_2O$, and $AcO_4M \cdot xH_2O$, wherein x varies based on the nature of M;
- acetylacetonates (the group $C_2H_7CO_2^-$, abbreviated $AcAc^-$) selected from AcAcM, $AcAc_2M$, $AcAc_3M$, and $AcAc_4M$;
- acetylacetonate hydrates (the group $C_2H_7CO_2^-$, abbreviated $AcAc^-$) selected from $AcAcM \cdot xH_2O$, $AcAc_2M \cdot xH_2O$, $AcAc_3M \cdot xH_2O$, and $AcAc_4M \cdot xH_2O$, wherein x varies based on the nature of M;
- chlorides selected from MCl, $MCl_2$, $MCl_3$, $MCl_4$, $MCl_5$, and $MCl_6$;
- chlorides hydrates selected from $MCl \cdot xH_2O$, $MCl_2 \cdot xH_2O$, $MCl_3 \cdot xH_2O$, $MCl_4 \cdot xH_2O$, $MCl_5 \cdot xH_2O$, and $MCl_6 \cdot xH_2O$, wherein x varies based on the nature of M;
- bromides selected from MBr, $MBr_2$, $MBr_3$, $MBr_4$, $MBr_5$, and $MBr_6$;
- bromides hydrates selected from $MBr \cdot xH_2O$, $MBr_2 \cdot xH_2O$, $MBr_3 \cdot xH_2O$, $MBr_4 \cdot xH_2O$, $MBr_5 \cdot xH_2O$, and $MBr_6 \cdot xH_2O$, wherein x varies based on the nature of M;
- iodides selected from MI, $MI_2$, $MI_3$, $MI_4$, $MI_5$, and $MI_6$;
- iodides hydrates selected from $MI \cdot xH_2O$, $MI_2 \cdot xH_2O$, $MI_3 \cdot xH_2O$, $MI_4 \cdot xH_2O$, $MI_5 \cdot xH_2O$, and $MI_6 \cdot xH_2O$, wherein x varies based on the nature of M;
- carboxylates (abbreviated $RCO_2^-$, and including acetates) selected from $MRCO_2$, $M(RCO_2)_2$, $M(RCO_2)_3$, $M(RCO_2)_4$, $M(RCO_2)_5$, and $M(RCO_2)_6$;
- carboxylates hydrates (abbreviated $RCO_2^-$) selected from $MRCO_2 \cdot xH_2O$, $M(RCO_2)_2 \cdot xH_2O$, $M(RCO_2)_3 \cdot xH_2O$, $M(RCO_2)_4 \cdot xH_2O$, $M(RCO_2)_5 \cdot xH_2O$, and $M(RCO_2)_6 \cdot xH_2O$, wherein x varies based on the nature of M;
- nitrates selected from $MNO_3$, $M(NO_3)_2$, $M(NO_3)_3$, $M(NO_3)_4$, $M(NO_3)_5$, and $M(NO_3)_6$;
- nitrates hydrates selected from $MNO_3 \cdot xH_2O$, $M(NO_3)_2 \cdot xH_2O$, $M(NO_3)_3 \cdot xH_2O$, $M(NO_3)_4 \cdot xH_2O$, $M(NO_3)_5 \cdot xH_2O$, and $M(NO_3)_6 \cdot xH_2O$, wherein x varies based on the nature of M;
- nitrites selected from $MNO_2$, $M(NO_2)_2$, $M(NO_2)_3$, $M(NO_2)_4$, $M(NO_2)_5$, and $M(NO_2)_6$;
- nitrites hydrates selected from $MNO_2 \cdot xH_2O$, $M(NO_2)_2 \cdot xH_2O$, $M(NO_2)_3 \cdot xH_2O$, $M(NO_2)_4 \cdot xH_2O$, $M(NO_2)_5 \cdot xH_2O$, and $M(NO_2)_6 \cdot xH_2O$, wherein x varies based on the nature of M;
- cyanates selected from MCN, $M(CN)_2$, $M(CN)_3$, $M(CN)_4$, $M(CN)_5$, $M(CN)_6$;
- cyanates hydrates selected from $MCN \cdot xH_2O$, $M(CN)_2 \cdot xH_2O$, $M(CN)_3 \cdot xH_2O$, $M(CN)_4 \cdot xH_2O$, $M(CN)_5 \cdot xH_2O$, and $M(CN)_6 \cdot xH_2O$, wherein x varies based on the nature of M;
- sulfides selected from $M_2S$, MS, $M_2S_3$, $MS_2$, $M_2S_2$, $MS_3$, $M_3S_4$, $MS_5$, and $M_2S_7$;
- sulfides hydrates selected from $M_2S \cdot xH_2O$, $MS \cdot xH_2O$, $M_2S_3 \cdot xH_2O$, $MS_2 \cdot xH_2O$, $M_2S_2 \cdot xH_2O$, $MS_3 \cdot xH_2O$, $M_3S_4 \cdot xH_2O$, $MS_5 \cdot xH_2O$, and $M_2S_7 \cdot xH_2O$, wherein x varies based on the nature of M;
- sulfites selected from $M_2SO_3$, $MSO_3$, $M_2(SO_3)_3$, $M(SO_3)_2$, $M_2(SO_3)_2$, $M(SO_3)_3$, $M_3(SO_3)_4$, $M(SO_3)_5$, and $M_2(SO_3)_7$;
- sulfites hydrates selected from $M_2SO_3 \cdot xH_2O$, $MSO_3 \cdot xH_2O$, $M_2(SO_3)_3 \cdot xH_2O$, $M(SO_3)_2 \cdot xH_2O$, $M_2(SO_3)_2 \cdot xH_2O$, $M(SO_3)_3 \cdot xH_2O$, $M_3(SO_3)_4 \cdot xH_2O$, $M(SO_3)_5 \cdot xH_2O$, and $M_2(SO_3)_7 \cdot xH_2O$, wherein x varies based on the nature of M;
- hyposulfite selected from $M_2SO_2$, $MSO_2$, $M_2(SO_2)_3$, $M(SO_2)_2$, $M_2(SO_2)_2$, $M(SO_2)_3$, $M_3(SO_2)_4$, $M(SO_2)_5$, and $M_2(SO_2)_7$;
- hyposulfite hydrates selected from $M_2SO_2 \cdot xH_2O$, $MSO_2 \cdot xH_2O$, $M_2(SO_2)_3 \cdot xH_2O$, $M(SO_2)_2 \cdot xH_2O$, $M_2(SO_2)_2 \cdot xH_2O$, $M(SO_2)_3 \cdot xH_2O$, $M_3(SO_2)_4 \cdot xH_2O$, $M(SO_2)_5 \cdot xH_2O$, and $M_2(SO_2)_7 \cdot xH_2O$, wherein x varies based on the nature of M;
- sulfate selected from $M_2SO_3$, $MSO_3$, $M_2(SO_3)_3$, $M(SO_3)_2$, $M_2(SO_3)_2$, $M(SO_3)_3$, $M_3(SO_3)_4$, $M(SO_3)_5$, and $M_2(SO_3)_7$;
- sulfate hydrates selected from $M_2SO_3 \cdot xH_2O$, $MSO_3 \cdot xH_2O$, $M_2(SO_3)_3 \cdot xH_2O$, $M(SO_3)_2 \cdot xH_2O$, $M_2(SO_3)_2 \cdot xH_2O$, $M(SO_3)_3 \cdot xH_2O$, $M_3(SO_3)_4 \cdot xH_2O$, $M(SO_3)_5 \cdot xH_2O$, and $M_2(SO_3)_7 \cdot xH_2O$, wherein x varies based on the nature of M;
- thiosulfate selected from $M_2S_2O_3$, $MS_2O_3$, $M_2(S_2O_3)_3$, $M(S_2O_3)_2$, $M_2(S_2O_3)_2$, $M(S_2O_3)_3$, $M_3(S_2O_3)_4$, $M(S_2O_3)_5$, and $M_2(S_2O_3)_7$;
- thioulfate hydrates selected from $M_2S_2O_3 \cdot xH_2O$, $MS_2O_3 \cdot xH_2O$, $M_2(S_2O_3)_3 \cdot xH_2O$, $M(S_2O_3)_2 \cdot xH_2O$, $M_2(S_2O_3)_2 \cdot xH_2O$, $M(S_2O_3)_3 \cdot xH_2O$, $M_3(S_2O_3)_4 \cdot xH_2O$, $M(S_2O_3)_5 \cdot xH_2O$, and $M_2(S_2O_3)_7 \cdot xH_2O$, wherein x varies based on the nature of M;
- dithionites selected from $M_2S_2O_4$, $MS_2O_4$, $M_2(S_2O_4)_3$, $M(S_2O_4)_2$, $M_2(S_2O_4)_2$, $M(S_2O_4)_3$, $M_3(S_2O_4)_4$, $MS_2O_4)_5$, and $M_2(S_2O_4)_7$;
- dithionites hydrates selected from $M_2S_2O_4 \cdot xH_2O$, $MS_2O_4 \cdot xH_2O$, $M_2(S_2O_4)_3 \cdot xH_2O$, $M(S_2O_4)_2 \cdot xH_2O$, $M_2(S_2O_4)_2 \cdot xH_2O$, $M(S_2O_4)_3 \cdot xH_2O$, $M_3(S_2O_4)_4 \cdot xH_2O$, $M(S_2O_4)_5 \cdot xH_2O$, and $M_2(S_2O_4)_7 \cdot xH_2O$, wherein x varies based on the nature of M;
- phosphates selected from $M_3PO_4$, $M_3(PO_4)_2$, $MPO_4$, and $M_4(PO_4)_3$;
- phosphates hydrates selected from $M_3PO_4 \cdot xH_2O$, $M_3(PO_4)_2 \cdot xH_2O$, $MPO_4 \cdot xH_2O$, and $M_4(PO_4)_3 \cdot xH_2O$, wherein x varies based on the nature of M;
- carbonates selected from $M_2CO_3$, $MCO_3$, $M_2(CO_3)_3$, $M(CO_3)_2$, $M_2(CO_3)_2$, $M(CO_3)_3$, $M_3(CO_3)_4$, $M(CO_3)_5$, $M_2(CO_3)_7$;
- carbonate hydrates selected from $M_2CO_3 \cdot xH_2O$, $MCO_3 \cdot xH_2O$, $M_2(CO_3)_3 \cdot xH_2O$, $M(CO_3)_2 \cdot xH_2O$, $M_2(CO_3)_2 \cdot xH_2O$, $M(CO_3)_3 \cdot xH_2O$, $M_3(CO_3)_4 \cdot xH_2O$, $M(CO_3)_5 \cdot xH_2O$, and $M_2(CO_3)_7 \cdot xH_2O$, wherein x varies based on the nature of M;

hypochlorites/chlorites/chlorates/cerchlorates (abbreviated $ClO_n^-$, n=1, 2, 3, 4) selected from $MClO_n$, $M(ClO_n)_2$, $M(ClO_n)_3$, $M(ClO_n)_4$, $M(ClO_n)_5$, and $M(ClO_n)_6$;

hypochlorites/chlorites/chlorates/perchlorates hydrates selected from $MClO_n \cdot xH_2O$, $M(ClO_n)_2 \cdot xH_2O$, $M(ClO_n)_3 \cdot xH_2O$, $M(ClO_n)_4 \cdot xH_2O$, $M(ClO_n)_5 \cdot xH_2O$, and $M(ClO_n)_6 \cdot xH_2O$, wherein x varies based on the nature of M, and n=1, 2, 3, 4;

hypobromites/bromites/bromates/berbromates (abbreviated $BrO_n^-$, n=1, 2, 3, 4) selected from $MBrO_n$, $M(BrO_n)_2$, $M(BrO_n)_3$, $M(BrO_n)_4$, $M(BrO_n)_5$, and $M(BrO_n)_6$;

hypobromites/bromites/bromates/perbromates hydrates selected from $MBrO_n \cdot xH_2O$, $M(BrO_n)_2 \cdot xH_2O$, $M(BrO_n)_3 \cdot xH_2O$, $M(BrO_n)_4 \cdot xH_2O$, $M(BrO_n)_5 \cdot xH_2O$, and $M(BrO_n)_6 \cdot xH_2O$, wherein x varies based on the nature of M, and n=1, 2, 3, 4;

hypoiodites/iodites/iodates/periodates (abbreviated $IO_n^-$, n=1, 2, 3, 4) selected from $MIO_n$, $M(IO_n)_2$, $M(IO_n)_3$, $M(IO_n)_4$, $M(IO_n)_5$, and $M(IO_n)_6$;

hypochlorites/chlorites/chlorates/perchlorates hydrates selected from $MIO_n \cdot xH_2O$, $M(IO_n)_2 \cdot xH_2O$, $M(IO_n)_3 \cdot xH_2O$, $M(IO_n)_4 \cdot xH_2O$, $M(IO_n)_5 \cdot xH_2O$, and $M(IO_n)_6 \cdot xH_2O$, wherein x varies based on the nature of M, and n=1, 2, 3, 4;

Metal alkyls;

Metal alkoxides;

Metal amines;

Metal phosphines;

Metal thiolates;

Combined cation-anion single source precursors, i.e., molecules that include both cation and anion atoms, for example of the formula $M(E_2CNR_2)_2$ (for example: M=a metal as defined herein, E=S, P, Se, Te, O, As, and R=alkyl, amine alkyl, silyl alkyl, phosphoryl alkyl, phosphyl alkyl).

In each of the above metal sources, the value of x, which may or may not be an integer, is dependent on the nature of M and the particular case, and may vary to produce any known metal source, as defined.

In some embodiments, the metal source is selected from $AuCl_3$, silver acetylacetonate and copper acetylacetonate.

In the above representative selection of metal sources, the metal M may be selected amongst transition metals selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Zn, Y, Zr, Nb, Tc, Ru, Mo, Rh, W, Au, Ag, Mn, Co, Cd, Hf, Ta, Re, Os, Ir and Hg. In some embodiments, the metal is Cu, Au or Ag.

The at least one reducing agent is a co-reductant selected to reduce the metal source to a metal (zero valency). As explained herein, once a region of the semiconductor oxide layer is etched and the semiconductor material exposed, in the presence of the at least one metal source, reduction of the metal source may occur by the semiconductor material, which is, in some cases, assisted by or occurs also by the at least one reducing agent also present. The at least one reducing agent is selected amongst mild reducing agent, that is not by itself capable of substantially reducing the at least one metal source.

The at least one reducing agent is selected from organic and inorganic reducing agents. In some embodiments, the at least one reducing agent is selected from alcohols, such as methanol, ethanol, tert-butanol, phenol and glucose, and organic acids such as ascorbic acid.

In some embodiments, the at least one reducing agent is selected from ethanol, glucose, phenol and ascorbic acid. In some embodiments, the at least one reducing agent is ethanol.

The at least one etchant is selected to selectively remove (etch) a region of the oxide layer or film which is present or is intentionally formed for the purpose of e.g., protecting the semiconductor material, on the semiconductor surface at the vicinity of the first metal. The oxide layer on the semiconductor material may be a native oxide, namely an oxide which spontaneously formed on the surface of the semiconductor material, when exposed to, e.g., air, oxygen, humidity, oxidation material, etc. The oxide layer may alternatively be used as a protecting layer on top of the semiconductor material and thus may be caused to form at any one or more regions of the semiconductor surface.

As noted herein, the oxide layer need not be an oxide form of any one or more atoms making up the semiconductor material. In some embodiments, the oxide material, or otherwise a protective film of at least one etchable material may be formed on the semiconductor material so that it may protect the semiconductor material or for purposes of patterning as disclosed herein.

In some embodiments, the oxide layer is a native oxide layer.

The etchant is selected such that it is reactive towards or capable of removing the semiconductor oxide layer only at the junction region. It may not be reactive enough to remove the semiconductor oxide layer in the rest of the semiconductor structure. Thus, the at least one etchant is selected amongst Lewis acids and Lewis bases that are soluble in a non-aqueous solvent, incase water is not present. In some embodiments, the at least one etchant is water. In other embodiments, the at least one etchant is selected from at least one Lewis acid and/or at least one Lewis base and water.

The etchant employed in accordance with the invention is a chemical etchant. The etchant is typically a component in the processing solution, a liquid medium, which the semiconductor material is contacted with or in. The etchant may be the solvent of the processing solution or one of solvents or materials making up the solution.

The etchant is a mild etchant to the oxide layer, so that etching is selective and occurs at the vicinity of the metal-semiconductor junction. Such etching permits patterning of the oxide layer and eventually patterning of the metal regions (second metal regions) grown onto the semiconductor and/or first metal object. The etching removes at least a region of an oxide layer, at the vicinity of the metal semiconductor junction. The size of the "at least a region of the oxide layer" which is removed by etching may be dependent upon process conditions, the particular etchant (e.g., reactivity, concentration, etc.), the constitution and nature of the oxide layer, the semiconductor material, the metal-semiconductor junction, the solution (solvents, other agents therein), etc. The at least a region of an oxide layer may be in any shape and size.

In some embodiments, the at least one region of an oxide layer or the sum of all oxide regions which are etched at the vicinity of the metal-semiconductor junction may be at the nanometer size or at a few micrometer size. In some embodiments, the region of the oxide layer removed is between 1 nm to 3,000 nm. In some embodiments, the region of the oxide layer removed is between 1 nm to 1,000 nm. In some embodiments, the region of the oxide layer removed is between 10 nm to 1,000 nm. In some embodiments, the region of the oxide layer removed is between 1 nm to 500 nm. In some embodiments, the region of the oxide layer been removed is between 10 nm to 500 nm. In some embodiments, the region of the oxide layer removed is between 50 nm to 500 nm. In some embodiments, the region of the oxide layer removed is between 50 nm to 300 nm. In some embodiments, the region of the oxide layer removed is above 1 nm. In some embodiments, the region of the oxide layer removed is above 10 nm. In some embodiments, the region of the oxide layer removed is above 20 nm. In some embodiments, the region of the oxide layer removed is above 30 nm. In some embodiments, the region of the oxide layer removed is above 50 nm.

The etching is selective at the vicinity of the metal-semiconductor junction (interface), and the at least one oxide region removed is at the vicinity of said junction. The term "at the vicinity of the junction" or alternatively "at the vicinity of the first metal" encompass etching or oxide material or layer or film removal at the interface (junction). The vicinity of the interface may also encompass a few nanometers from said interface, e.g., 1 or 2 or 3 or 4 or 5 or 6 or 7 or 8 or 9 or 10 or 15 or 20 or 30 or 40 or 50 nm from said interface.

The "contacting" step of the at least one metal-semiconductor junction with reactants of the hybrid structure is carried out, in solution, by e.g., adding, immersing, mixing, injecting, a processing or reactant solution (e.g., at least one etchant, at least one metal source and optionally at least one reluctant) with or to the metal-semiconductor junction. In some embodiments, the metal-semiconductor junction or the substrate it is on is immersed in the solution. In some embodiments, the solution is added drop-wise or placed by any other means onto the metal-semiconductor junction and/or the substrate it is on. In some embodiments, the substrate may comprise one or more metal-semiconductor junctions and/or one or more objects (e.g., nanowires) comprising said at least one metal-semiconductor junction.

The solution may comprise of additional reactants for building the hybrid nanostructure of the invention, e.g., organic ligands which support the metal clusters or tip growth, organic solvents and ligands used for assisting the process (etching and/or metal growth) and others. In some embodiments, the ligand is at least one thioalkyl, e.g., hexane thiol.

In some embodiments, the process temperature is room temperature (between 22 and 30° C.). In further embodiments, the temperature range is between 20° C. and 50° C. In other embodiments, the process involves heating. In some embodiments, the temperature range is between 15° C. and 100° C.

The etching and the metal region(s) growth (second metal regions) are carried out in chemical manners or by chemical synthesis. The etching and the metal regions growth may be carried out in solution.

The metal region(s) (or metal clusters of the at least one second metal) grown at the vicinity of the junction may cover essentially the entire removed oxide layer region. In some embodiments, the metal region(s) covers essentially the entire metal semiconductor interface. In some embodiments, the metal region(s) covers essentially the entire first metal region. In some embodiments, the metal region(s) covers partially the removed oxide layer region. In some embodiments, the metal region(s) covers partially metal semiconductor interface. In some embodiments, the metal region(s) covers partially the first metal region. In some embodiments, the number of regions on the object (first metal and/or interface and/or exposed semiconductor region) is at least one. In some embodiments, the number of metal regions on a substrate is 2 or 3 or 4 or 5 or 6 or 7 or 8 or 9 or 10.

Where nanowires are substrates of the invention, the metal regions are, in some cases, only at the nanowire tip or tips (ends or edges). Thus, nano-florets of the invention consist of a single tip-formed and tip-concentrated metal region. Each such single metal region may be composed of a plurality of metal clusters, provided that they cover a continuous semiconductor-metal region.

The plurality of metal clusters may be densely packed. In some embodiments, each cluster is in contact with at least one other metal cluster in the metal region. In some embodiments, each cluster is in contact with at least two other metal clusters in the metal region. In some embodiments, each cluster is in contact with at least other metal cluster and all metal clusters in the metal region are directly or indirectly in contact.

These metal clusters may be of any shape. The size of the metal clusters or tips is typically in the nanometric regime. Typically, these metal clusters or metal tips are smaller than the first metal region (metal cap). The size (diameter, cross section) of the metal clusters may be less than 40% or 35% or 30% or 20% or 15% or 10% or 5% or 4% or 3% or 2% or 1% of the size of the metal cap in a bare nanowire. In some embodiments, the size of the metal clusters is below 500 nm. In some embodiments, the size of the metal clusters is below 300 nm. In some embodiments, the size of the metal clusters is below 200 nm. In some embodiments, the size of the metal clusters is below 100 nm. In some embodiments, the size of the metal clusters is below 50 nm. In some embodiments, the size of the metal clusters is below 40 nm. In some embodiments, the size of the metal clusters is below 30 nm. In some embodiments, the size of the metal clusters is below 20 nm. In some embodiments, the size of the metal clusters is below 15 nm. In some embodiments, the size of the metal clusters is below 10 nm. In some embodiments, the size of the metal clusters or the metal tips is between 1 and 500 nm. In some embodiments, the size of the metal clusters or the metal tips is between 1 and 300 nm. In some embodiments, the size of the metal clusters is between 1 and 100 nm. In some embodiments, the size of the metal clusters is between 1 and 50 nm. In some embodiments, the size of the metal clusters is between 1 and 30 nm. In some embodiments, the size of the metal clusters is between 1 and 20 nm. In some embodiments, the size of the metal clusters is between 1 and 10 nm.

In another aspect, the invention provides a self-formed hybrid semiconductor-metal nanostructure manufactured according to any one process of the invention.

In some embodiments, the hybrid nanostructure is a nano-floret structure.

The invention thus provides in another of its aspects a nano-floret comprising or consisting each a semiconductor nanowire having a metallic tip. The metal tip may be in the form of a metal cap connected at the end of the nanowire or in the form of a coat which covers the tip of the nanowire and a region of the nanowire neck (in the form of a so-called finger glove).

In some embodiments, the nano-floret structures of the invention are constructed of a metallic tip which is 100 s of nanometers in length (e.g., between 90 nm and 900 nm) along the long axis of the nanowire, starting at the tip of the nanowire, and of a semiconductor nanowire which is 10 s of micron long (e.g., between 10 and 100 microns).

The aspect ratio of the nanowire may be above 100. In some embodiments, the nanowire aspect ratio is above 1,000. In some embodiments, the nanowire aspect ratio is above 10,000. In some embodiments, the nanowire aspect ratio is above 100,000. In some embodiments, the nanowire aspect ratio is above 1,000,000.

The aspect ratio of the nanowire may be between 1,000 and 100,000.

In some embodiments, the nanowire aspect ratio is between 100 and 1,000,000. In some embodiments, the nanowire aspect ratio is between 1,000 and 1,000,000. In some embodiments, the nanowire aspect ratio is between 10,000 and 1,000,000. In some embodiments, the nanowire aspect ratio is between 100,000 and 1,000,000.

The nano-floret structures of the invention benefit from superior physics of tunneling devices and may be utilized for sensing while making use of conventional device processing techniques and compatibility with semiconductor processing technologies.

Thus, the invention further contemplates a surface associated with one or a plurality of nano-florets according to the invention. In some embodiments, the nano-florets are substantially perpendicular to the surface. In other embodiments, the nano-florets are substantially parallel to the surface.

The hybrid (nano-floret) nanostructure of the invention and those prepared according to the invention may be used in a variety of electronic and opto-electronic applications and in the construction of a variety of electronic and opto-electronic devices or elements thereof.

The device of the invention implements one or more of the hybrid nanostructures of the invention and/or a hybrid nanostructure obtained by a process of the invention.

The processes and the hybrid nanostructure of the invention find utility in a vast range of industrial applications, such as application in electrical devices, optical devices, plastic devices, transparent devices, consumer electronics, industrial electronics, wireless systems, space applications, military applications, civil applications, medical applications and many other applications.

In some embodiments, the device of the invention may be used for constructing a field effect transistor (FET) on an active device area of a device substrate.

In some embodiments, the device of the invention is used for producing heating elements and thermal insulators.

In some embodiments, the device of the invention is used for producing catalytic materials.

In a further aspect, the invention provides a device comprising at least one hybrid nanostructure of the invention or plurality or array of hybrid nanostructures according to the invention or obtainable by a process of the invention.

In some embodiments, the device is an electronic device (transistor, diode) in a form selected from n-p-n, p-n-p and n-i-p.

In some embodiments, the device is selected from a diode and/or a transistor and/or an electronic circuit component and/or an integrated circuit and/or a detector and/or a switch and/or an amplifier and/or a transducer and/or a laser and/or a tag and/or a photoconductor; a photodiode and/or a photovoltaic cell and/or a light emitting diode (LED) and/or a light sensor and/or a display and/or and a large area display array.

In some embodiments, the device of the invention is used as a detector. In some embodiments the detector is a thermal detector. Non-limiting examples of detectors are Near Infra-red (NIR), Short-wave infrared (SWIR) and mid-wave infrared (MWIR) detectors.

In some embodiments, the device of the invention is used as a bolometer.

In some embodiments, the nano-florets of the invention may be utilized as nano-gap sensors for the detection and monitoring of a variety of materials.

As known in the art, detection and monitoring of volatile chemical compounds in the environment is in increasing need for numerous aspects of every-day life and well-being. Electrical detection is advantageous over a variety of other available detection methods because it allows relatively simple and low cost design of the end products and relying on Si nanowires makes the fabrication process compatible with current semiconductor industry standards.

Most nanowire sensors operate as Field-effect transistors (FET) where the chemical binding event changes the local electric field and results in the detection signal. Other class of sensors and devices relies on nano-gap devices where a tunneling current is passed through nano-scale gap. Any binding event that takes place within or next to the nano gap alters the tunneling current and translates to a detection event.

The invention disclosed herein is further directed to a simple sensitive tunneling nano-gap device such as a nano-gap field effect transistor, which offers superior performance over nanowire FET devices. In an exemplary device, a pair of nano-floret structures is connected head-to-head (metal-to-metal) with a molecular moiety, forming well-defined nano-gap structure.

The tunneling device acts as an ultra-sensitive detector. Molecular binding by the molecular moiety or at the vicinity of the moiety alters the surface electrical potential, resulting in variation of the tunneling current through the device. This mechanism is analogous to a field effect transistor whereby the electric field gates the current through the channel underneath. The tunneling device mechanism introduces a gain to the readout signal and therefore can serve as a sensitive sensor. The tunneling current is very sensitive to the surface potential shape therefore it is possible to tune the device gain to be different in the 'on' and 'off' states (larger for the 'on' state). This mode of operation provides signal to noise ratio improvement. This effect should be analogous and even stronger to that of tuning a field effect transistor to work in the sub-threshold limit for the off state.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIGS. 3A-D depict water assisted growth of Au-NF. (FIG. 3A) Left to right: TEM images obtained for Au-NF prepared with specified water concentrations of 0, 0.28, 0.82, 1.62, and 2.64M (scale bar is 50 nm). Quantification of Au cap deposition, (FIG. 3B) Au cap diameter (dH) and (FIG. 3C) Au cap length (L) as a function of water concentration. (FIG. 3D) Mass spectrometry (MS) analysis of the dissolved Ge obtained in the deposition solution containing the specified water concentration with 1 mM $AuCl_3$ (■) and without $AuCl_3$ (●, ×10).

(FIG. 4A-i) and (FIG. 4B-i), SEM images of Au-NF (the yellow regions were used for FIB sectioning). (FIG. 4A-ii) and (FIG. 4B-ii), TEM images of Au-NF samples sectioned by FIB at the indicated positions. (FIG. 4C-i), SEM image, and (FIG. 4C-ii), EDS profile obtained for the broken line indicated in (FIG. 4C-i), wherein the higher count line is for Au, and the lower count line is for Ge.

(FIG. 5A) Left to right: TEM images of the Au-NF obtained using 14%, 67%, 86% and 95% Ge/Si NWs (scale bars represent 50 nm). (FIG. 5B) Au cap diameter and (FIG. 5C) Au cap length as a function of the NW composition.

(FIG. 6C) Correlation of dissolved Ge concentrations obtained for the deposition and blank solution process for the specified SiGe NW compositions showing a constant ratio of 7:1 for all SiGe NW compositions studied (R2≠0.97).

(FIG. 8A) 0%, (FIG. 8B) 1%, (FIG. 8C) 2%, (FIG. 8D) 5%, (FIG. 8E) 10%, (FIG. 8F) 20%, (FIG. 8G) 50%, and (FIG. 8H) 100%. (FIG. 8I) size distribution of dH (■) and L (●) vs. amount of EtOH in the solution. Scale bars represent 50 nm.

(FIG. 10A) TEM images obtained for Ag—NF prepared in anhydrous EtOH/acetonitrile solution (FIG. 10A-i) and in 1M of $H_2O$ in EtOH/acetonitrile solution (FIG. 10A-ii). Evolution of the Ag tip as a function of the $H_2O$ concentration, tip diameter (FIG. 10A-iii) and tip length (FIG. 10A-iv). (FIG. 10B) TEM images obtained for Cu—NF prepared in an anhydrous EtOH/DCM solution (FIG. 10B-i) and in EtOH/DCM with 2.64M of $H_2O$ (FIG. 10B-ii). The Cu tip evolved as a function of the $H_2O$ concentration, tip diameter (FIG. 10B-iii) and tip length (FIG. 10B-iv). The scale bar is 50 nm for all of the TEM images. (FIG. 10C) The step by step deposition of bimetallic (Au, Ag)—NF prepared with 1.62M of $H_2O$, (FIG. 10C-i) The STEM image and (FIG. 10C-ii) the corresponding EDS profile measured along the broken. (FIG. 10D) Step by step deposition of bimetallic (Au, Cu)—NF prepared with 1.62M of $H_2O$, (FIG. 10D-i) the STEM image, and (FIG. 10D-ii) the corresponding EDS profile measured along the broken line.

(FIG. 11A) SiGe NW film weight obtained for specified CVD process durations showing linear dependence (R2=0.99). ICP-MS analysis of the dissolved Ge vs. film weight (length) for NW films immersed in deposition solution, (FIG. 11B) and in blank solution, (FIG. 11C) Deposition solution contained: EtOH, 1 mM $AuCl_3$ and 1.62M $H_2O$. Blank solution was identical except for omitting the $AuCl_3$. 1:18 Si:Ge NWs.

(FIG. 13A) TEM images of Au—NF structures obtained without thiol, and (FIG. 13B) with 5 mM hexanethiol. Both preparations were with 1 mM $AuCl_3$ and 1.62M $H_2O$ in EtOH. Scale bars 50 and 20 nm (insets). (FIG. 13C) Grain size analysis obtained for Au—NF deposition with and without hexanethiol.

(FIG. 15A) Vis-NIR spectra for SiGe NWs and Au—NF.

(FIG. 15B) Difference spectrum obtained by subtraction of 'NFs'-'NWs' spectra shown in panel (a). (FIG. 15C) Raman signal enhancement of TP-functionalized Au-NFs for the specified excitation wavelengths: 785 nm, 514 nm, and 355 nm. (FIG. 15D) Raman signal enhancement of TP-functionalized Au—NFs compared with unprocessed SiGe NWs and bare SiGe NWs. The four main peaks of TP are designated by at 1000, 1024, 1072, and 1574 $cm^{-1}$.

(FIG. 16A) Raman spectra measured for Au—NF, Ag—NF, and (Au,Ag)—NF. The four main peaks of thiophenol are designated by "*" at 1000, 1024, 1072, and 1574 $cm^{-1}$. (FIG. 16B) Corresponding integrated peak area of the 1072 $cm^{-1}$ peak shown in (a).

FIG. 24A shows a typical Ge detector layer structure and the locations at which LSPR nanoshells absorbers are incorporated. Introducing the nanoshells in the middle of the PN active layer is most effective for sensitivity enhancement and spectral response broadening (FIG. 24B). A simpler approach with lower quantum efficiency enhancement is achieved by adding the LSPR nanoshells absorbers on top of detector by using a grid top contact (FIG. 24C).

DETAILED DESCRIPTION OF EMBODIMENTS

The ability to control the process was studied using various water concentrations, different metals, and different SiGe alloy compositions, as exemplary system of the invention, to deduce the roles of each factor and the respective mechanisms involved. Overall, ex situ transmission electron microscopy (TEM), in situ scanning transmission electron microscopy (STEM) using a novel fluid cell TEM holder and inductively coupled plasma mass spectrometry (ICP-MS) techniques were used to study the mechanistic reaction details and progression of the various processes. The analyses provided structural and chemical information regarding the processes that occurred and explained the underlying mechanisms.

Figure 1:
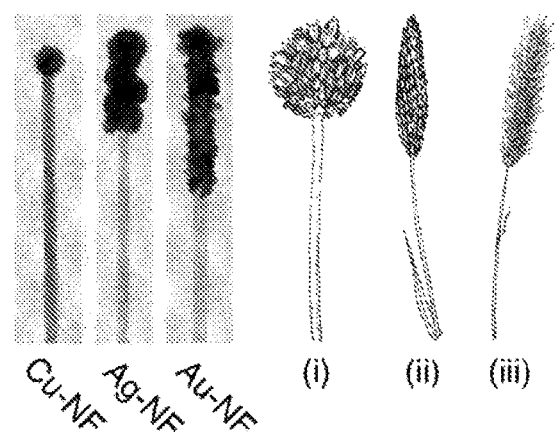
FIG. 1 demonstrates the resemblance of Au/SiGe nanowire morphologies obtained by self-processing according to the invention to grass flowers or 'florets' (inspired by the use of water for initiating the SP synthesis). These structures are termed nano-floret (NF)-like structures.
Figure 2:
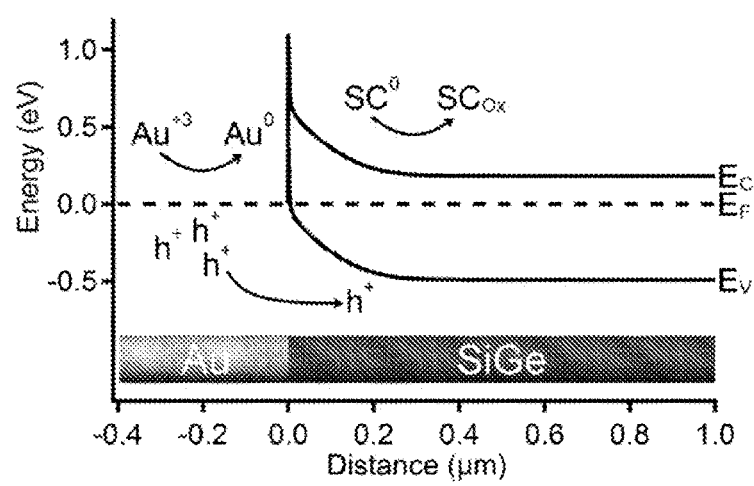
FIG. 2 presents Au-SiGe schottky junction band diagram. Calculated band diagram (top) and simulated structure (bottom). Semiconductor conduction (EC) and valance (EV) band energies relative to the gold Fermi level (EF). Calculated for a 1:18 SiGe alloy with a low n-type doping level of $10^{16}$ cm$^{-3}$ using Sentaurus TCAD (Synopsys Inc., Mountain View, California, U.S.A.)

The structural evolution with respect to the process parameters, such as water concentrations in the deposition solutions and the SiGe alloy composition, were studied using energy dispersive X-ray spectroscopy (EDS). In addition, ICP-MS analyses were performed on the process solutions to quantify the dissolved Ge levels as a function of the process parameters. The SC-Au nanoparticle (NP) junction present at the SiGe NW tip set an inherent asymmetry in the nanowire electronic structure (FIG. 2). The Au—semiconductor junction at the nanowire tip was further exploited for catalyzing both the SiGe oxide layer etching and for promoting metal deposition processes triggered by water as a mild etchant toward the native oxide of the SiGe alloy. The structural evolution was quantified by measuring the head diameter (dH, FIG. 3B) and the metal deposition length at the tip area (L, FIG. 3C).

Overall, dH remained constant and was independent of the water concentration (dH<65 nm for the SiGe NWs diameter used). In contrast, the metal deposition length L at the SiGe NW surface abruptly increased to <360 nm in water in EtOH concentrations greater than <1.0M (FIG. 3C). A further increase of the water concentration did not result in further growth beyond 360 nm neck length, indicating a self-limiting process (FIG. 3C).

Figures 4A, 4B, 4C:
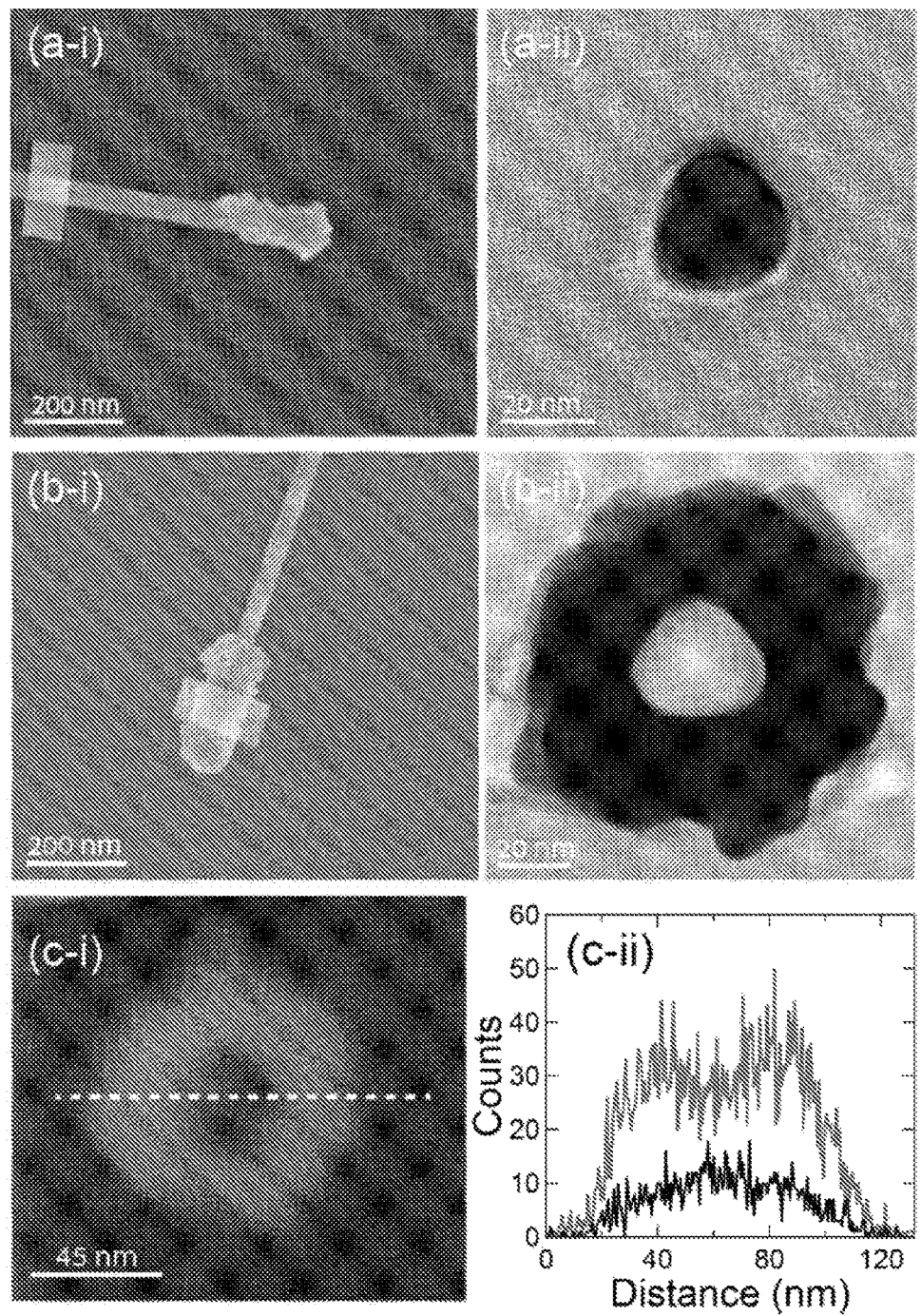
FIGS. 4A-C present cross sectional analysis of Au-NF structures.

The structures of the fully evolved Au—NFs were further characterized by preparing cross-sectional focused ion beam (FIB) lamellae, which were subsequently analyzed using TEM, EDS, and scanning electron microscopy (SEM) at different regions of the structure (FIG. 4).

To quantify the dissolved Ge concentration as it evolves during the deposition process, ICP-MS was used for a range of water concentrations (FIG. 3D). The dissolved Ge experiments were performed by immersing the SiGe NWs in, EtOH with 1 mM $AuCl_3$ and using water concentrations in the range of 0.0 (anhydrous) to approximately 3.0M. This process was termed a "deposition solution" process, whereas the repetition of the procedure with identical conditions and without the metal salt was called the "blank solution" process.

The ICP-MS results indicate an increase in dissolved Ge concentrations with increased water addition (with saturation at approximately 8 mmol $H_2O$ for both the blank and deposition solutions). An increase of approximately 7-fold was obtained in dissolved Ge comparing the deposition solution with blank solution processes for each water concentration (FIG. 3D).

Figures 5A, 5B, 5C:
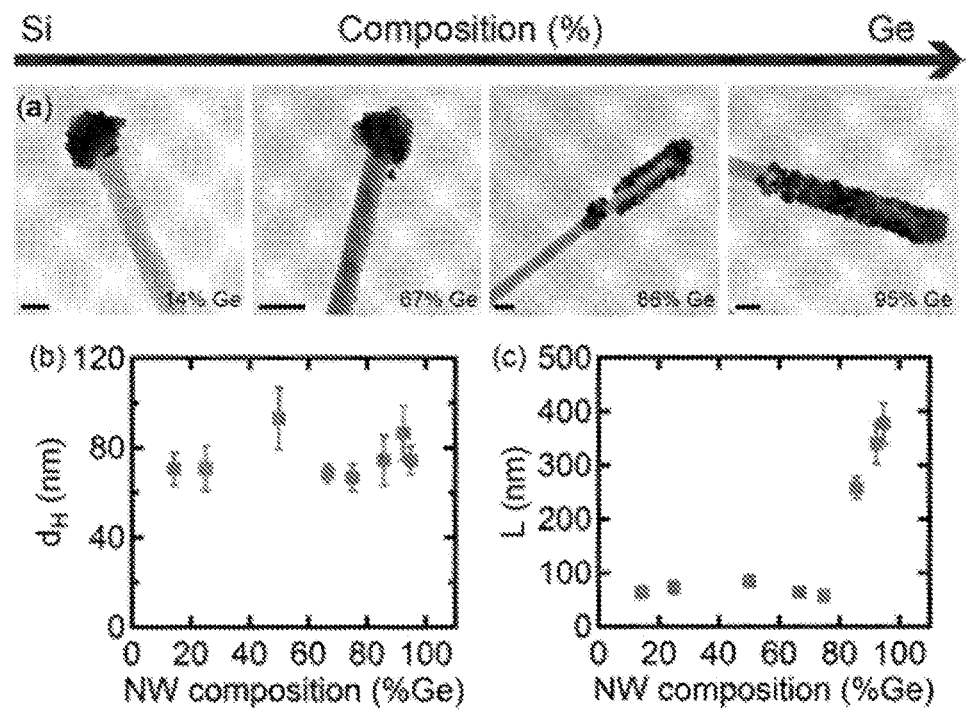
FIGS. 5A-C show Au—NF structures obtained for various SiGe NW compositions.

Subsequently, the Au-NF morphology and dissolved Ge levels were studied for various SiGe nanowire alloy compositions (TEM, FIG. 5, and ICP-MS, FIG. 6). The TEM data showed that the Au cap deposition at the nanowire tip (dH) was constant for the different SiGe nanowire compositions (FIG. 5B). In contrast, the Au deposition length sharply increased for the SiGe composition above approximately 80% Ge (FIG. 5C). Notably, the deposition of the gold shell at the tip region was not complete, showing limited surface coverage for nanowire compositions below approximately 90% Ge, which further support the role of aurophilic interactions, as further discussed below. The CVD process parameters and the corresponding SiGe nanowire compositions measured for the various nanowire synthesis processes are provided Table 1 and FIG. 7.

TABLE 1

SiGe NW synthesis conditions for various compositions using CVD

| | Growth parameters | | | |
|---|---|---|---|---|
| Ratio (Si:Ge) | $SiH_4$ flow (sccm) | $GeH_4$ (10% in $H_2$) flow (sccm) | Pressure (torr) | Temperature (° C.) |
| 0:1 | 0 | 25 | 50 | 276 |
| 6:1 | 1.5 | 2.5 | 35 | 360 |
| 3:1 | 1.5 | 5 | 35 | 340 |
| 1:1 | 4 | 40 | 45 | 280 |
| 1:2 | 1.5 | 30 | 45 | 247 |
| 1:3 | 1 | 30 | 45 | 247 |
| 1:6 | 1 | 60 | 45 | 247 |
| 1:18 | 0.5 | 90 | 45 | 247 |

Figures 6A, 6B, 6C:
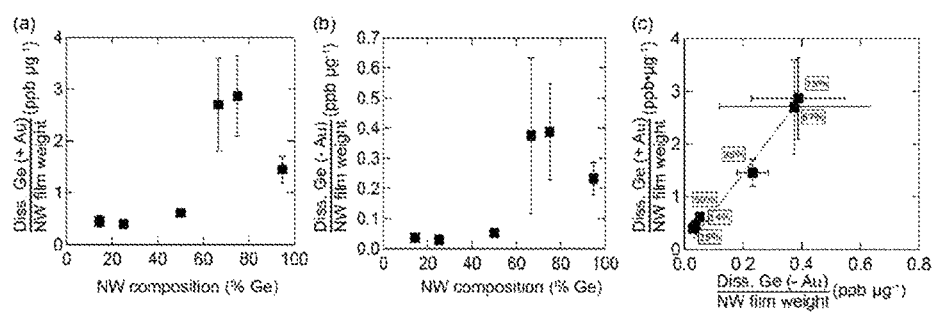
FIGS. 6A-C present ICP-MS quantification of dissolved Ge for specified SiGe NW compositions. SiGe NWs were immersed for 5 min in (FIG. 6A) deposition solution, and (FIG. 6B) blank solution. Specific Ge dissolution was obtained by dividing dissolved Ge concentrations by the total NW film weight. Deposition solution contained: EtOH, 1 mM $AuCl_3$ and 1.62M $H_2O$. Blank solution was identical except for omitting the $AuCl_3$.
Figure 7:
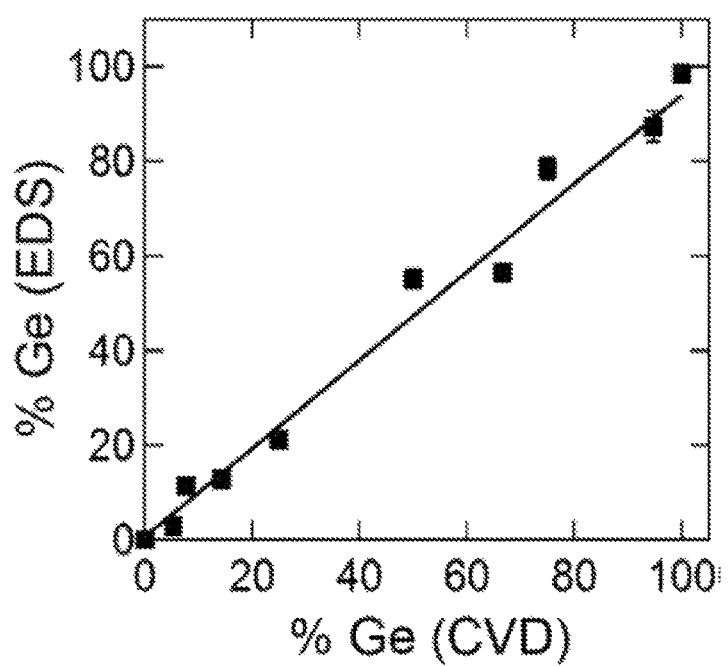
FIG. 7 provides EDS analysis of SiGe NWs obtained for specified $SiH_4/GeH_4$ gas mixture ratios. CVD synthesis conditions are listed in Table 1. For this measurement NWs were grown on glass substrates and transferred to a carbon film TEM support grids. These samples were measured using an FEI Magellan 400 SEM with an Oxford Instruments X-Max EDS detector.

The ICP-MS results showed similar trends with an abrupt increase in the dissolved Ge concentration for Ge contents of 70% or more for the deposition and blank solution processes (FIG. 6). Combining the ICP-MS results for the various nanowire compositions and water concentrations showed that the Ge dissolution strongly depends on both the SiGe composition and the water concentration. Furthermore, the evolution of the Au cap deposition obtained from TEM imaging and quantification of the dissolved Ge in solution by ICP-MS followed a similar trend with respect to water concentration in the deposition solution.

To account for the dissolved Ge levels and the progression of cap deposition, an electroless-type metal deposition process was assumed to have occurred in the presence of noble metal cations ($Au^{3+}$) because of galvanic displacement and metal assisted chemical etching (MACE) mechanisms. While $SiO_2$ is a stable oxide that requires relatively harsh etch conditions, such as HF for dissolution, pure $GeO_2$ is prone to dissolution in mild conditions and even in moist environments due to assistance by the MACE mechanism. Therefore, water can be used as a mild etchant for removing the native oxide of Si—Ge alloys. Adjusting the SiGe nanowire composition tuned the overall stability of the SiGe alloy native oxide toward dissolution in the presence of water to a level where the native oxide is stable toward water dissolution as long as it is decoupled from the metal assisted etch. The removal of the native oxide from the SiGe nanowire surface results in an exposed surface that is prone to undergo a galvanic displacement reaction with $Au^{3+}$ metal ions, generating oxidized semiconductor and resulting in additional Ge dissolution.

Generally, MACE promotes semiconductor oxidation near the semiconductor-noble metal junction, where holes accumulate and the gold NP used during the CVD synthesis of the nanowire function as an electron acceptor, further catalyzing metal deposition at the Au NP surface at the tip of the nanowire. In other words, the metal assisted catalytic deposition occurring at the Au catalyst surface is coupled with the MACE process that occurs at the semiconductor portion.

Figures 8A, 8B, 8C, 8D, 8E, 8F, 8G, 8H, 8I:
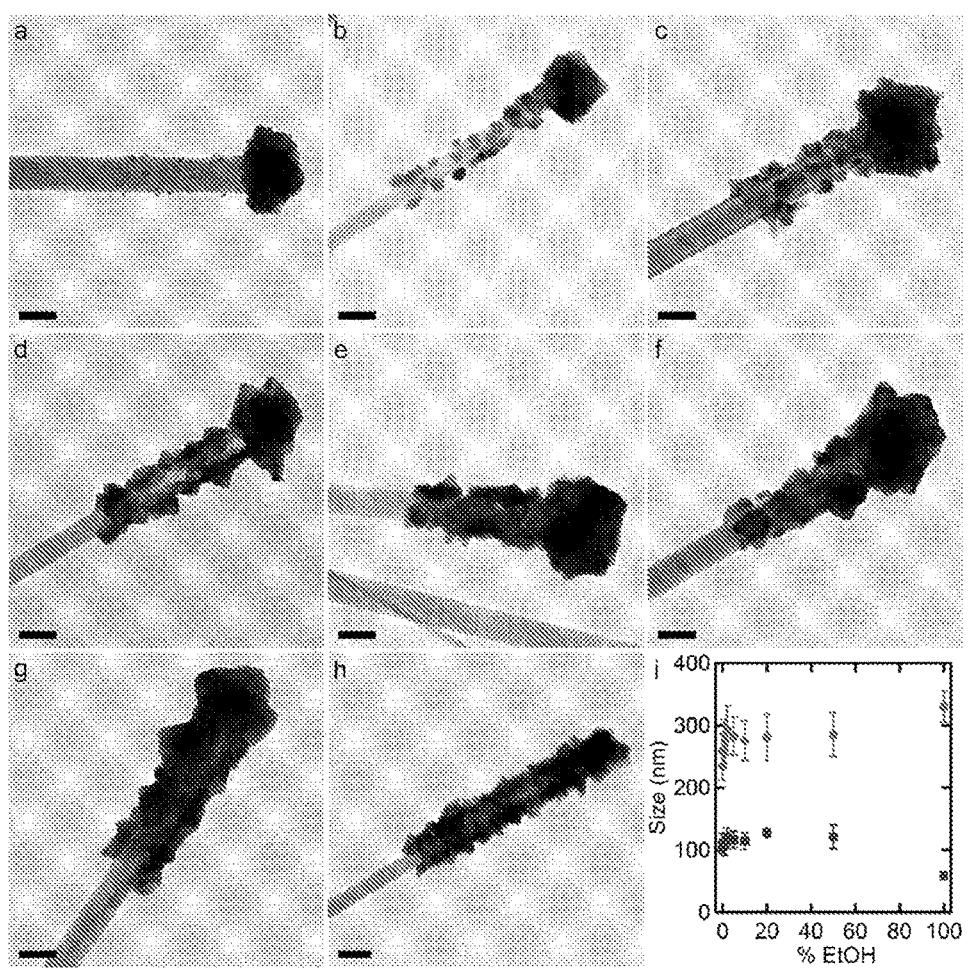
FIGS. 8A-I provide TEM images of NF synthesized with 1 mM $AuCl_3$ and 1.62M of $H_2O$ in the specified EtOH/tert-butanol mixtures (% v/v)

In addition, the EtOH serves not only as a solvent but also as a reducing agent during the neck deposition step. This was studied by mixtures of tert-butanol-EtOH for the deposition process (FIG. 8). tert-Butanol was used as the solvent for these studies because a tertiary alcohol does not take part in surface redox reactions and thus it acts as a redox-inert solvent system. Nano-floret synthesis in neat tert-butanol resulted in Au deposition at the surface and only sparse metal deposition at the neck up to a well-defined distance from the semiconductor-Au interface at the nanowire tip (FIG. 8A). Addition of EtOH to the tert-butanol solution led to deposited metal tip which evolved gradually with the EtOH fraction showing increase in the Au clusters density and size. These results suggest that Au clusters nucleate at the exposed Ge surface following the MACE removing the native oxide layer at the neck region by galvanic displacement. The nuclei growth is then catalyzed by the oxidation of the EtOH over the Au nuclei surface, where the EtOH function as a reducing agent toward the metal salt.

Figures 9A, 9B, 9C, 9D, 9E:
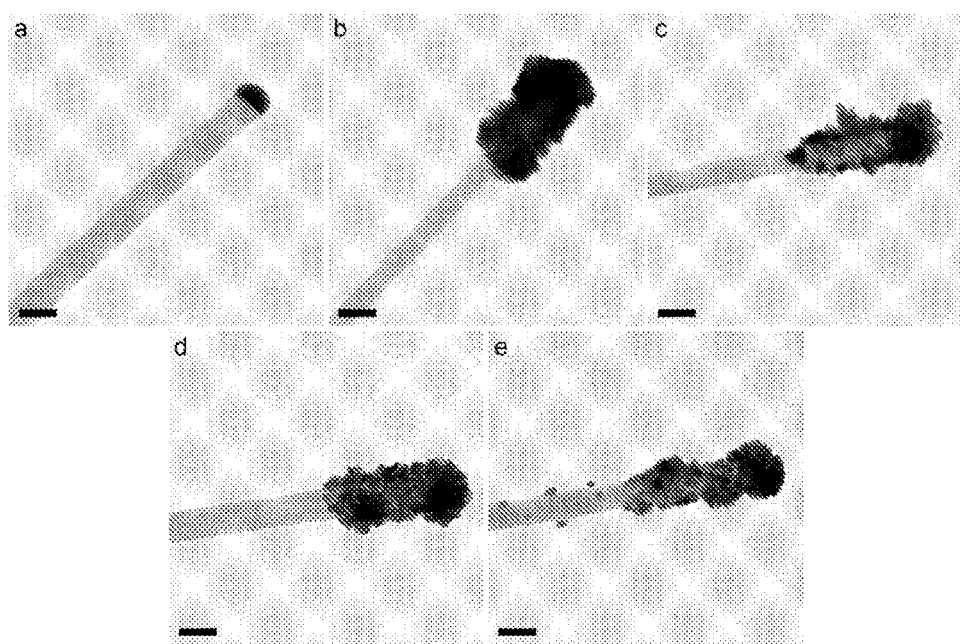
FIGS. 9A-E provide TEM images of NF synthesized with various reducing agents. Deposition performed in tert-butanol solution with 0.5 mM of $AuCl_3$, 1.32 M of $H_2O$ and (FIG. 9A) 6.18M of MeOH, (FIG. 9B) 4.28M of EtOH, (FIG. 9C) 13.9 mM of glucose, (FIG. 9D) 7.30M of phenol (FIG. 9E) 58.1 mM of ascorbic acid. Scale bars represent 50 nm.

It is further demonstrated that EtOH acts not only as solvent but also for promoting redox reactions. Alternative reducing agents may be selected from glucose, phenol and ascorbic acid; all reducing agents resulted in nano-floret structures with different morphologies while keeping similar overall dH and L dimensions (FIG. 9).

Nano-floret synthesis was studied for other metals, including Ag and Cu, which together with Au constitute the coinage metal elements, all showing NF structures with different morphologies as detailed below (see FIG. 10). In contrast, Pd and even Pt salts did not yield such structures, although Pt provides a high driving force for the process, further supporting the role of the coinage metals in surface-catalyzed redox reactions that drive the nano-floret synthesis process. It is suggested that the process which is carried out under anaerobic conditions is terminated by the formation of surface-bound species such as Au—H which prevent further metal deposition.

Figures 11A, 11B, 11C:
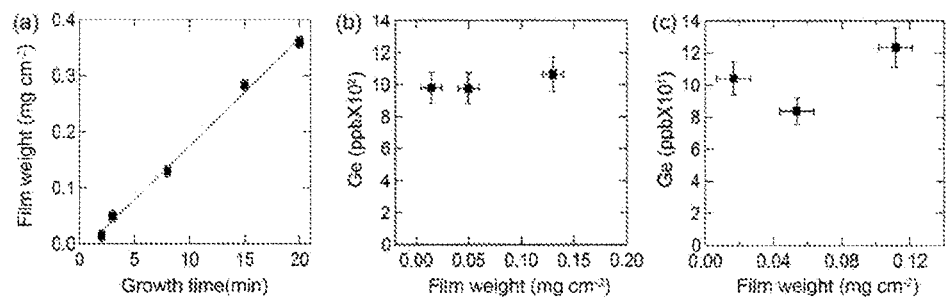
FIGS. 11A-C depicts dissolved Ge vs. NW length.

Furthermore, a constant ratio of approximately 7 was identified for dissolved Ge for all studied SiGe alloy compositions when analyzing the resulting solutions for deposition and blank (without gold) processes (FIG. 6, R2≈0.97). The fixed ratio of 7/1 obtained for the corresponding deposition/blank processes for the various SiGe ratios suggests that a fixed number of redox events with a well defined stoichiometry take place upon dissolution of the oxide layer and exposure of the pristine semiconductor surface. The surface redox reactions resulted in the deposition of reduced $Au^0$ clusters at the exposed nanowire tip region and the oxidation of the SiGe alloy, which was further dissolved into the deposition solution, resulting in the increased Ge levels with fixed proportion. To confirm that the native oxide etch was localized to the nanowire tip area, dissolved Ge levels were quantified as a function of nanowire length. The ICP-MS analysis gave constant dissolved Ge levels for all nanowire growth times, namely, all of the studied nanowire lengths (SiGe 1:18, FIG. 11).

This result indicated that dissolved Ge was independent of the nanowire length and the total nanowire surface area, which increase linearly with the nanowire length. This finding agrees with the MACE mechanism, in which the oxide etch is restricted to the metal-semiconductor junction near the nanowire tip, irrespective of the total native oxide layer surface (see FIG. 2 for the calculated Au—SiGe junction band diagram). Controlling the SiGe alloy composition extends beyond tuning the SiGe alloy native oxide stability toward MACE. To form a metal cap with structural robustness at the exposed nanowire tip, suitable Au—Au and Au-semiconductor surface interactions are required. Pure Si surfaces exhibit poor adhesion of the reduced metal clusters relative to Ge. Furthermore, it was previously reported for Ge surfaces that Au—Ge covalently binds with a well-defined stoichiometry. Thus, tuning the SiGe alloy composition also plays a role in the formation of aurophilic interactions, subsequent formation of Au—Ge and Au—Au and stabilization of the reduced metal at the tip region.

Figure 12:
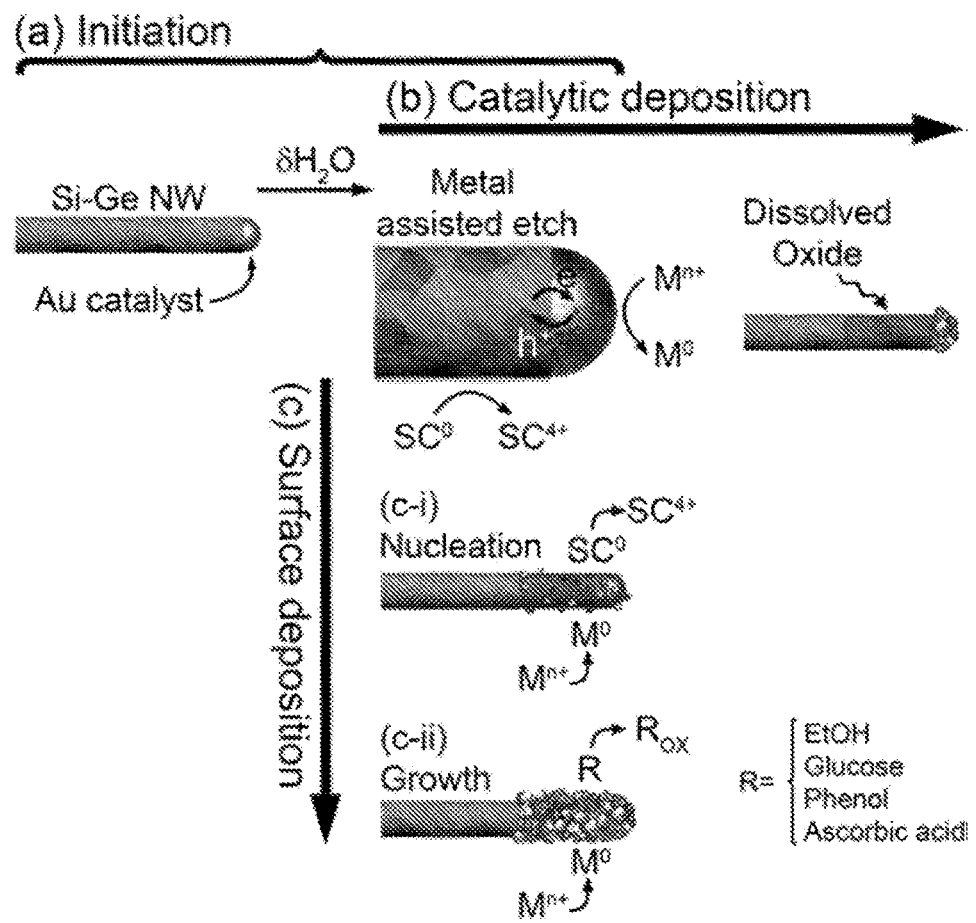
FIG. 12 presents a summary of Au-NF hybrid nanostructure synthesis and the mechanism for SiGe alloy nanowires (SiGe NWs). (a) Process initiation by mild etching using water that removes the SiGe alloy oxide layer at the SC-metal (Au) tip region. (b) Catalytic metal deposition at the Au catalyst edge. (c) Metal deposition at the exposed SiGe NW surface tip region. The SiGe alloy native oxide layer is locally removed in the presence of water by metal-assisted chemical etching due to the SC—Au junction that is inherently present at the CVD synthesized NW edge. Galvanic redox reactions at the exposed SC tip region result in metal cation reduction and nucleation. Metal clusters grow at the nuclei assisted by the catalytic redox reactions driven by the reducing agent (R). This process stops when the exposed SC at the tip region is completely covered with a metal layer, probably involving surface poisoning with Au—H species at the anaerobic conditions of the synthesis which results in a self-limiting process.

Overall, the Au-nano-floret synthesis involves a sequence of localized etching of the semiconductor oxide layer and self-limiting metal deposition to yield $Au^0$ cap deposition with well-defined dimensions at the nanowire tip. The cap deposition process involves two metal deposition mechanisms, direct galvanic displacement at the exposed semiconductor surface and catalytic metal deposition, metal assisted catalytic deposition, at the nanowire tip, resulting in dissolved Ge in the solution, and self-termination of the process upon full coverage of the exposed semiconductor region. A summary of the NF synthesis mechanisms and various processes is presented in FIG. 12.

Figures 13A, 13B, 13C:
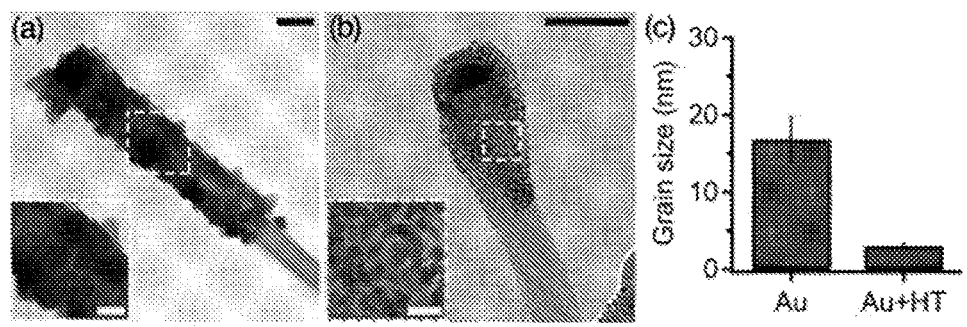
FIGS. 13A-C show Au—NF cluster size and morphology tuning.

Additional fine-tuning of the Au-nano-floret structures morphology was demonstrated for controlling the size of deposited Au clusters by adding alkylthiols to the Au-nano-floret process solution. Au-nano-floret prepared using the same procedure while adding 5 mM hexanethiol in the deposition solution result in a significantly smaller average Au cluster size (3±0.3 nm) compared with Au-nano-florets prepared in the absence of hexanethiol (17±3 nm) (FIG. 13). The smaller cluster size with hexanethiol molecules resulted because thiols were bound with the freshly formed Au clusters and formed a self-assembled monolayer that functions as a passivation layer on the pristine Au clusters. The thiol self-assembled monolayer formed in situ during Au-nano-floret synthesis, blocking electron transfer and halting cluster growth. Furthermore, binding of the hexanethiol molecules at the freshly formed Au cluster surface diminished the aurophilic interactions and subsequent Au—Au bond formation.

Figures 10A, 10B, 10C, 10D:
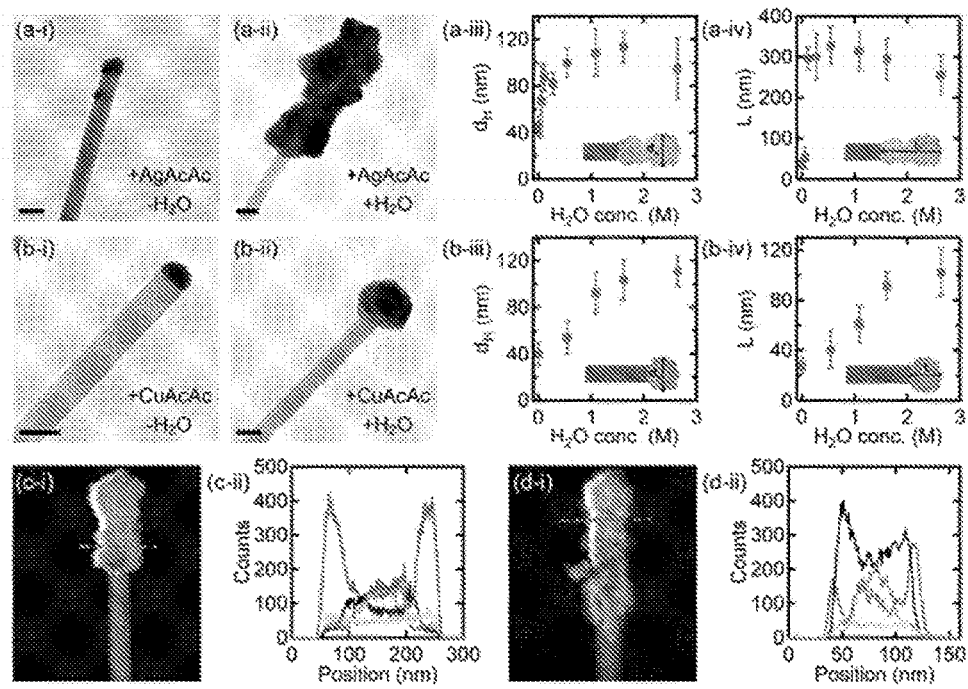
FIGS. 10A-D regard synthesis of coinage metal (Cu, Ag, and Au)—NF structures.
Figure 14:
FIG. 14 demonstrates fabrication of SC-metal hybrid nanostructures. Using (a) self-processing synthesis and (b) conventional top-down processing sequence.

Overall, the results revealed that distinct processing steps can be identified that are analogous to those of conventional top-down processing, as depicted in FIG. 14. The structures are formed using a self-propagating sequence that includes etching, deposition, modification and self-termination of the transformations. The scope of nano-floret synthesis was further generalized to depositing Ag and Cu. Together with Au, these metals constitute the coinage metal group. The silver deposited nano-floret, Ag-nano-floret, had a similar morphology to that of the Au-nano-floret with a metal cap deposited at the nanowire tip near the semiconductor-Au NP junction region (FIG. 10A). The diameter of the deposited Ag head (dH) was ~130 nm for all of the studied water concentrations, except for the anhydrous solution, in which nearly no such deposition was observed (FIG. 10A-iii). An Ag cap deposition length (L) of ~300 nm was obtained for all of the water concentrations, except for the anhydrous solution, in which no significant deposition was observed (FIG. 10A-iv). For copper deposited nano-floret, Cu-nano-floret resulted in a distinct morphology compared with Au- and Ag-nano-floret. In addition, Cu-nano-floret displayed a spherical structure and its dH and L increased as water concentration increased and became saturated at ~110 nm (FIG. 10B). This result could be attributed to the lower standard redox potentials of $Cu^{2+}$ compared with the other metals studied here ($E°(Cu^{2+}/Cu)=+0.340$ V, $E°(Ag^+/Ag)=+0.799$ V, and $E°(Au^{3+}/Au)=+1.498$ V).

It is suggested that the reduction of $Cu^{2+}$ to $Cu^0$ is restricted to the semiconductor-Au NP surface by metal assisted catalytic deposition and occurs at the Au tip of the SiGe nanowire. In other words, the SiGe-Au junction catalyzes $Cu^{2+}$ reduction and deposition by promoting the accumulation of holes at the semiconductor-noble metal interface and injection of electrons to the Au catalyst surface. The lower standard redox potential for Cu only results in deposition via metal-assisted catalytic deposition because the driving force for the direct galvanic displacement process is not sufficient. In contrast, for Au- and Ag-nano-floret, the standard redox potential is sufficiently positive for activating the direct galvanic displacement at the exposed semiconductor interface (where the native oxide is removed by MACE) and the metal-assisted catalytic deposition mechanism at the nanowire tip. Finally, the formation of bimetallic nano-floret structures was achieved by stepwise deposition of (Au, Ag)-nano-floret and (Au, Cu)-nano-floret, as shown in FIGS. 10C and 10D, respectively.

The optical absorbency of the nano-floret films was measured on quartz slides using an integrating sphere showing a broad plasmonic band (FIG. 15). The plasmon resonance of the metallic nano-floret nanostructures exhibit significant local electromagnetic field enhancement which is the origin of the enhancement in SERS.

Figures 15A, 15B, 15C, 15D:
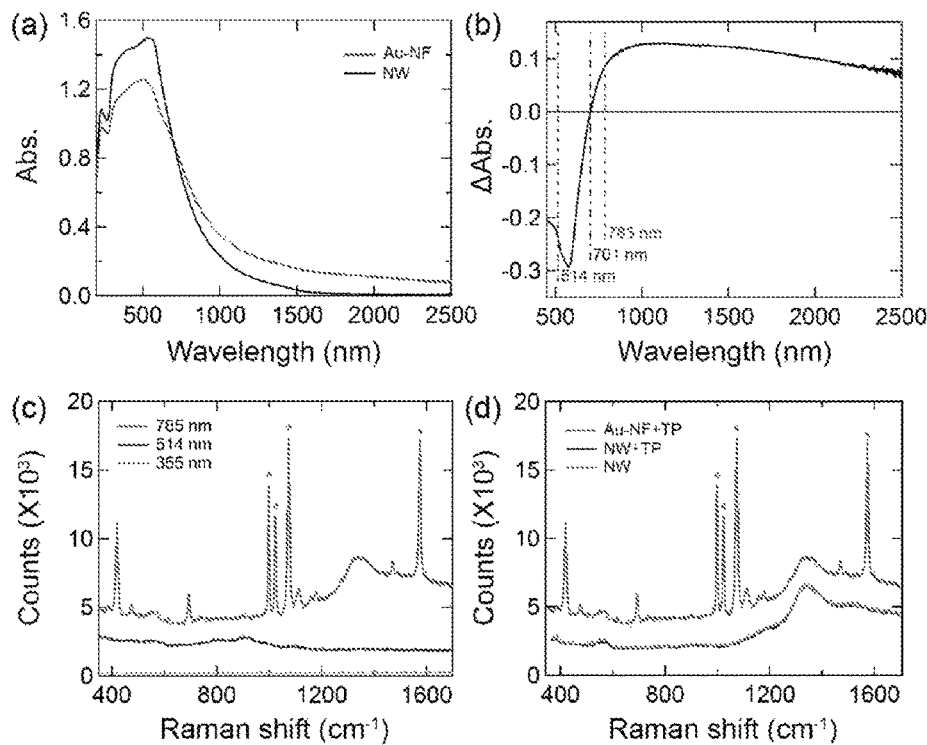
FIGS. 15A-D provide optical absorption and SERS measurements for thiophenol (TP)-functionalized Au—NF.
Figures 16A, 16B:
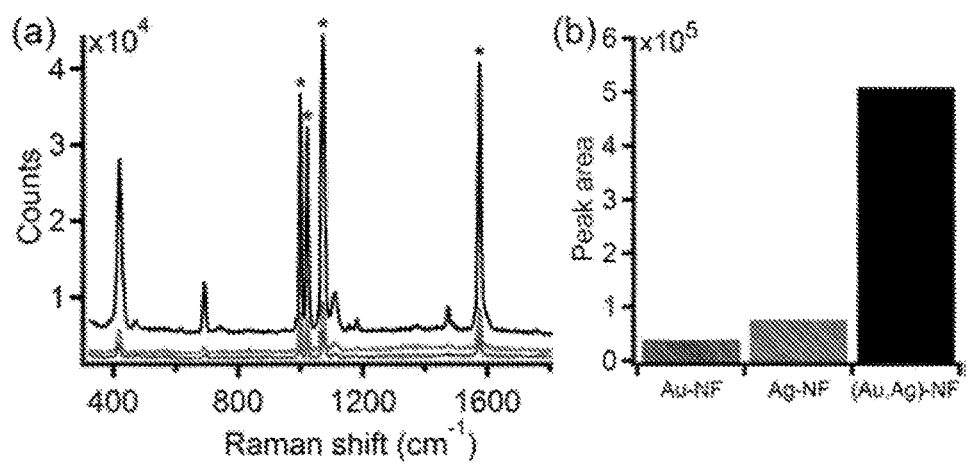
FIGS. 16A-B demonstrate SERS enhancement of thiophenol over NF films.

Metallic nano structures are well known for their utility in probing adsorbed probe molecules with high amplification of the Raman signal commonly termed SERS. The plasmonic absorption was utilized to demonstrate the application of nano-floret films as SERS substrates using thiophenol monolayer. Raman spectra measured for thiophenol-functionalized Au-nano-floret, Ag-nano-floret, and (Au,Ag)-nano-floret are presented in FIG. 16. The SERS signals obtained for monolayer of thiophenol were detected for Au-, Ag-, and (Au,Ag)-nano-floret with the highest SERS signal obtained for the bimetallic (Au,Ag)-nano-floret. In contrast, for nanowire films treated with the thiophenol molecules no Raman signals could be detected (FIG. 15D). Furthermore, the SERS intensity obtained for Au-nano-floret was studied for three excitation wavelengths, 355, 514, and 785 nm. The SERS signal enhancement was obtained for 785 nm in close relation to the plasmonic absorption onset at 701 nm shown in FIG. 15B. Excitation at shorter wavelengths, 355 and 514 nm which do not overlap with the plasmonic band did not result in SERS signals (FIG. 15C).

In summary, the inventors present a synthetic strategy that takes advantage of the inherent asymmetry of the NW structure with the SiGe—Au NP seed resulting from the VLS synthesis step. The SiGe—Au junction is important for activating etching, deposition, and modification steps. Control over the deposition and etching processes has been demonstrated by several knobs: (i) SiGe alloy composition, (ii) deposited metal redox potential, and (iii) etchant (water) concentration. Both the etching and deposition processes were confined to a well-defined region of the structure with similar processes and self-limiting kinetics. These traits allowed for structural control that is typically associated with top-down fabrication capabilities. It is demonstrated that such levels of control can be attained for bottom-up synthesis by cuing the local etching (MACE) of the SiGe alloy oxide layer, catalytic deposition of metal cations at the NW tip by MCD, and deposition at the exposed NW tip by GD. Introducing surfactants (HT) allowed further control over the deposited cluster size and morphology. Finally, demonstrated is the synthesis of bimetallic NFs when employing the coinage metals Au, Ag, and Cu. These bimetallic building blocks are highly attractive for catalysis, optical applications and more. The overall synthesis is termed SP due to the controllable, localized, and self-limiting sequence of events that occurs autonomously and results in the transformation of the SiGe NW structure into nano-flora-like hybrid nanostructures. In addition, the SP strategy demonstrated here for NF—HNS architectures enables interesting possibilities regarding controlled symmetry breaking at the nanoscale, which is an important feature for attaining complex nanosystems with intriguing functionalities. Such HNSs consist of metal and SC with distinct dimensionalities that encompass significant effects in a wide range of applications, such as photocatalysis, photovoltaics, sensing, energy harvesting and storage, and electronic devices. For example, the combination of SC nanorods with metallic NPs improved light harvesting because of the enhanced absorbance and charge separation properties of the combined nanosystem relative to the individual components.

Methods:

Synthesis of Silicon-Germanium (Si—Ge) Alloy Nanowire (NW)

Glass slides were cleaned using $O_2$ plasma (Pico plasma cleaner, Diener electronic GmbH) at 60 W for 2 min. Next, the slides were immediately incubated for 5 min in a poly-L lysine solution (0.1% in $H_2O$, Sigma-Aldrich) before being washed with ultra pure DI water (>18MΩ, ELGA purification system). Then, Au NPs were deposited from a citrate-stabilized water suspension (Ted Pella Inc.) and washed with DI water. The slides were then cleaned using $O_2$ plasma to remove any organic residues and contaminants. The NW synthesis was conducted using a custom-built CVD system. In addition, SiGe NWs with various alloy compositions were obtained by varying the appropriate process flow parameters for $GeH_4$ (10% in $H_2$) and pure SiH4 for specified time durations. The specific process parameters for the various SiGe alloys are provided in Table 1.

SiGe Nano-Floret (NF) Synthesis

First, SiGe alloy NWs were prepared on substrates and stored in an ambient atmosphere for 24 hr to form a native oxide layer. Then, Au—NFs were prepared by reacting the substrates with NWs in an EtOH solution (99%, ACROS Organics) containing 1 mM $AuCl_3$ (99%, ACROS Organics) and a specified water content for 3 min at room temperature. The treated substrates were carefully washed with EtOH and TDW to remove excess salts. Next, Ag-NFs were prepared using the same procedure with 1 mM silver acetylacetonate (98%, Aldrich) in acetonitrile (≥99.9% Merck). Then, Cu- NFs were prepared using a 10 mM copper acetylacetonate (98%, ACROS Organics) solution with EtOH/DCM 1/1 (v/v) (>99.8%, Sigma-Aldrich) and at the specified water content.

Transmission Electron Microscopy (TEM)

First, NW and NF were synthesized directly on TEM grids with 50 nm silicon nitride support films (Ted Pella Inc.) following the NF synthesis procedure described above. Then, TEM and STEM imaging were performed using an FEI Tecnai F20 G2 microscope with EDAX EDS detector.

Fluid Cell Scanning Transmission Electron Microscopy (STEM)

In situ observations of the Au growth on SiGe nanowires were performed using a Poseidon 200 fluid cell transmission electron microscopy holder (Protochips Inc.) in a double Cs-corrected JEOL 2200 FS microscope operated in scanning mode using a high-annular angular X-ray detector. The 3C probe setting and the smallest condenser aperture were used to optimize the contrast and resolution.

For these studies, SixNy membranes with nitride (50 nm thick) on top of Si chips were used with a spacer thickness of 500 nm (minimum fluid layer thickness in the beam direction). Before the observations, the SiGe nanowires were deposited on the lower chip to ensure a sufficient wire density on the membrane for TEM observation.

First, an anhydrous EtOH solution was pumped at a rate of 300 μl/hr before the 1 mM Au/EtOH solution was introduced after approximately 30 minutes. Next, alignment was performed, and suitable nanowires were selected. After adding the Au/EtOH solution, the sample was imaged under low magnification (20 k) to minimize beam-induced reactions. After the solution was pumped at a rate of 300 μl/hr, approximately 15 min passed before an increased STEM intensity could be observed at the nanowire tips. Subsequent, increasing the magnification to 100 k resulted in the deposition of Au nanoparticles within the observation area. To ensure that the Au deposition at the tips was not induced by electron beam nanowires outside the observation area were investigated and showed similar Au tip diameters and lengths.

Mass Spectroscopy (ICP-MS)

Quantification of dissolved Ge was performed by MS analysis using an Agilent Technologies 7500 cx ICP-MS with an Octopole Reaction System (ORS). An external calibration technique using Ge standards containing 0, 0.1, 0.5 and 1 ppm of Ge in 1% $HNO_3$ was used to obtain a calibration curve. Finally, the SiGe NW films were prepared on 22×22 mm slides, allowed to stand in the air for 24 hr after synthesis, and immersed in $EtOH/H_2O/AuCl_3$ and $EtOH/H_2O$ solutions.

Detection and Monitoring of Volatile Chemical—Background

Detection and monitoring of volatile chemical compounds in the environment is in increasing need for numerous aspects of every-day life and well-being. This includes the monitoring of air quality in urban areas, detection of volatile compounds associated with various diseases, and even the detection of explosives in airports and more. Accordingly, many methods were developed for sensing volatile compounds based on a large array of physical detection mechanisms, including electrical, optical, and fluorescence, and biological mechanisms using enzymes and even living bacteria. Among the physical mechanisms, some of the most promising approaches for constructing sensors are based on the use of nanowires for electrical detectors. Electrical detection is advantageous because it allows relatively simple and low cost design of the end products and relying on Si nanowires makes the fabrication process compatible with current semiconductor industry standards. As such, nanowire-based electrical detection of volatile compounds is an active field with both academic research and commercial applications developments. Most nanowire sensors operate as Field-effect transistors (FET) where the chemical binding event changes the local electric field and results in the detection signal. Other class of sensors and devices relies on nano-gap devices where a tunneling current is passed through nano-scale gap. Any binding event that takes place within or next to the nano gap alters the tunneling current and translates to a detection event. Nano-gap devices may offer superior performance over nanowire FET devices however the fabrication of the nano-gap is quite difficult using current methods.

The synthesis of a new class of hybrid nano-structures with floret-like architectures enables structures that consist of a metallic tip with 100 s of nanometer length scale, connected to a highly conductive semiconductor nanowire with 10 s of micron length scale. A key advance in making this approach feasible is the method developed for preparing pairs of such structures (dimers) where the gold tips of the nano-florets are connected with molecular linkers that result in well-defined nano-gap structures, determined precisely by the molecular details of the linker used. Overall, the newly developed synthesis offers an unprecedented method for the formation of a nano-gap devices connected to micron scale contacts using low-cost standard methods.

Figure 17:
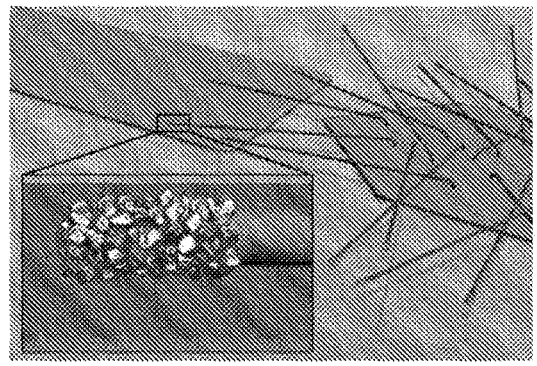
FIG. 17 depicts schematics of tunneling device fabrication using the nano-flora structures.

The self-processing nano-flora-based devices were realized using standard processing techniques. Two macroscopic contacts were formed on a substrate with patterned areas for selective growth. The electrical circuit was formed, as depicted in FIG. 17, between the macroscopic electrodes bridged by the nanoscopic gold tip and nanowire of the nano-flora units. Upon molecule adsorption, a tunnel barrier is formed passing current through the molecule-pad junction. The tunneling current is sensitive to the molecule properties and can be tuned by resonant light absorption.

Figure 18A:
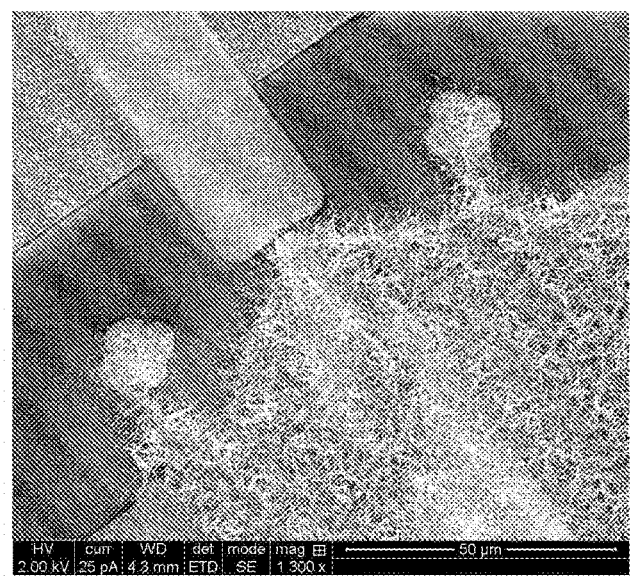
FIGS. 18A-B provide SEM images of the self-forming device featuring the nano flora architectures, in two different resolutions.
Figure 18B:
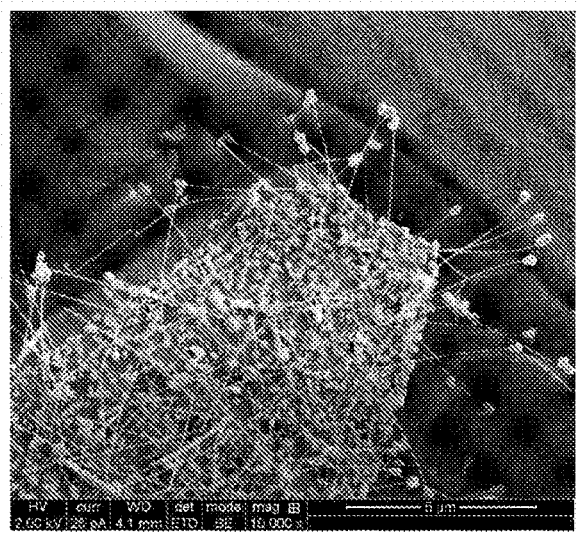

These properties supply the required device flexibility for detecting different targets. FIG. 18 presents realization of the concept.

Figure 19A:
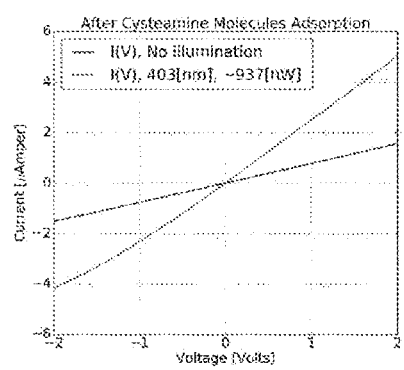
FIGS. 19A-B provide results showing response of fabricated device to adsorption of Cysteamine before and after illumination (FIG. 19A) and before and after Cysteamine adsorption (FIG. 19B).
Figure 19B:
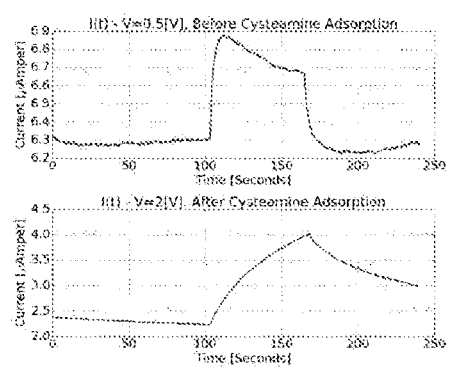

On the gold tips thiol and amine end group molecules may be self-assembled to form a MIM junction. As FIGS. 19A-B show, these junctions can act as a molecule detector, i.e. the electrical response changes due to the presence of the molecule. Such a device functions as a detector for volatile compounds, e.g., to serve in a large variety of military scenarios where weightless portable or wearable devices offering fast analysis are required. Moreover, this device provides a platform for fundamental molecular electronics research and even beyond electronic transport measurements, such as noise measurements, spin transport and thermoelectric effect.

Figure 20:
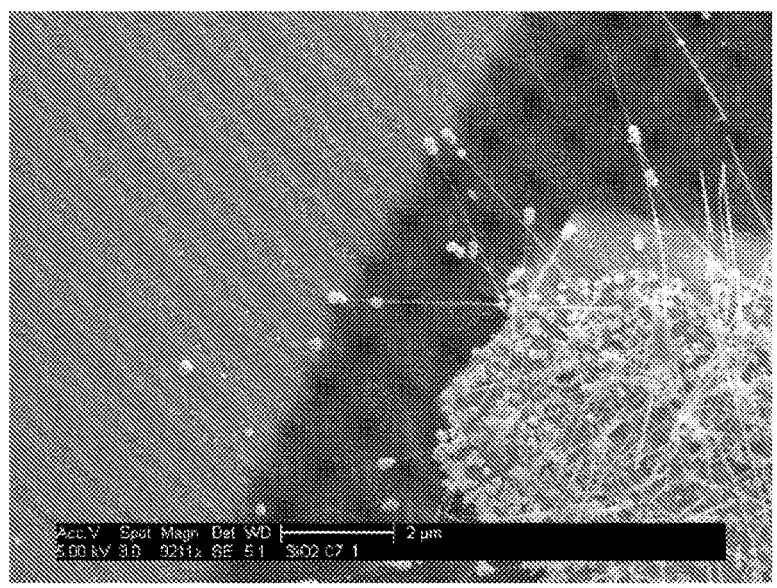
FIG. 20 provides a SEM image of the self-forming device with few nano flora connections.

Improved device sensitivity was achieved using junctions with fewer NF bridging across the macroscopic electrodes. The number of bridges was control by the selective growth on the gold covered area. Therefore, in the final device, junctions with different bridge concentration may help cover all sensitivity ranges. FIG. 20 shows sparse nano-floret bridge concentration. It is expected that tuning the density of NF will result in sensors sufficiently sensitive for detecting the adsorption of only a few molecules.

The Tunneling Device Act as an Ultra-Sensitive Detector

Figure 21:
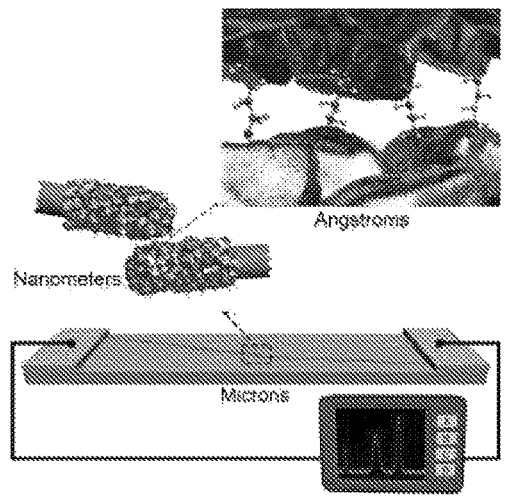
FIG. 21 depicts a device according to the invention. As shown, two nano-floret nanostructures are oriented head-to-head, forming a nano-gap bridged by a molecular moiety.
Figure 22:
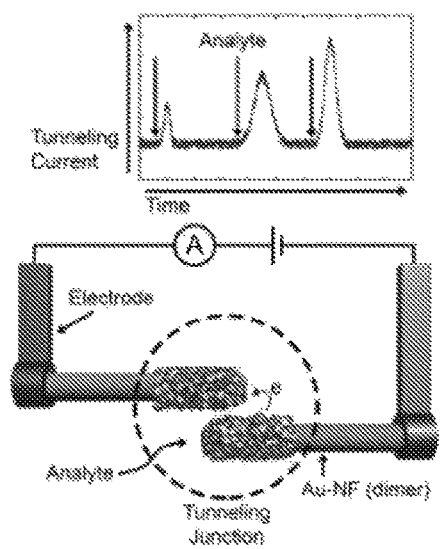
FIG. 22 depicts a further device according to the invention in a different construction to that shown in FIG. 21.

FIG. 21 depicts a device according to the invention. As shown, two nano-floret nanostructures are oriented head-to-head, forming a nano-gap bridged by a molecular moiety. Molecular binding at the surface alter the surface electrical potential, results in variation of the tunneling current through the device. This mechanism is analogous to a Field Effect Transistor whereby the electric field gates the current through the channel underneath. The tunneling device mechanism introduces a gain to the readout signal and therefore can serve as a sensitive sensor. The tunneling current is very sensitive to the surface potential shape therefore it is possible to tune the device gain to be different in the 'on' and 'off' states (larger for the 'on' state). This mode of operation provides signal to noise ratio improvement. This effect should be analogous and even stronger to that of tuning a field effect transistor to work in the sub-threshold limit for the off state. For graphical clarity in FIG. 22 only a few molecules are shown. A tightly-packed monolayer and acceptor molecules may be present at the nano gap interface.

Nano-Gap Devices Formed with Functional Materials

Devices according to the invention may be functionalized by materials such as thiols, amines and others, for achieving superior detection of molecules in, e.g., the gas phase. Such functional materials serve as bridges between the nano-floret heads and act as ligands for forming, e.g., charge-transfer complexes, analyte molecules, such as nitro-aromatics materials. Non-limiting examples of such functional materials are thiolated organic materials.

Near Infrared (NIR) and Short Wave Infrared (SWIR) Detectors

The research improves and extends the range of near infrared (NIR) and short wave infrared (SWIR) detectors for operating at the 1.7-2.5 µm range. The improved detector architecture makes use of conventional top-down complementary metal-oxide semiconductor (CMOS) fabrication of available detectors and integration of nanoshell structures with extended plasmonic absorption made by novel bottom-up synthesis which is compatible with standard CMOS processes. By using the plasmonic nanoshells the purpose was to enhance the response and the spectral range of polycrystalline Ge on Si detectors and enhance the responsivity for selected infrared bands in bolometers. Application-oriented end points offer a two-fold strategy: (I) a low cost, 'good enough' solution which is key for extending the applicability of NIR-SWIR detectors for currently out of reach appliances because of the poor performance of available low cost solutions or the high cost of high performance solutions, (II) a high-end solution offering enhanced capabilities for bolometers making them better tuned for specialized applications where cost is not the main concern.

The technology of the invention may thus be used for improving the performance of existing detectors at the Low SWIR range operating in the 1.7-2.5 µm window by two convenient approaches that rely on utilization of nanoshell structures with extended LSPR absorption: enhancement of the detector response range by spectral broadening and enhancement of the sensitivity for currently available CMOS compatible process.

The above improvements are obtained by coupling NIR-SWIR plasmonic absorbers with broad spectral response (0.8-3.0 µm) to existing detectors. The LSPR absorption is obtained by novel and simple synthesis of nanoshells with adjustable spectral response covering the desired range.

Figure 23:
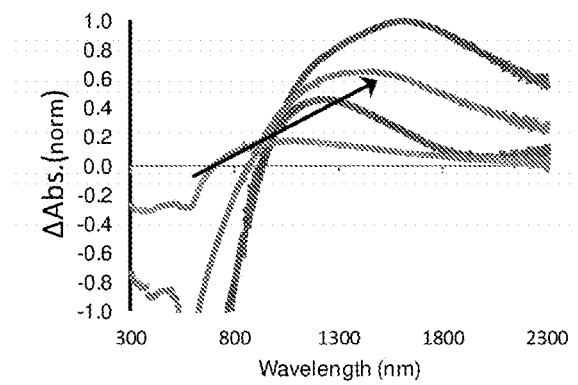
FIG. 23 presents NIR-SWIR absorption of Au nanoshells.

FIG. 23 presents NIR-SWIR absorption of Au nanoshells. The arrow indicates the increase of the LSPR absorption with addition of catalytic amounts of $H_2O$ during the nanoshells synthesis step (cut off at 2300 nm is due to the spectrophotometer setup range limit). The extended IR-SWIR absorption shown is due to the gold nanoshells structures formed at the nanowires tips. The decrease (negative Abs) in the visible range is the result of the nanowire film collapse by capillary interactions when dipped into the EtOH solution during synthesis. This effect is irrelevant for the present application since we will not use the nanowires, only the nanoshells after etch of the carrier nanowires as explained.

Figure 24A:
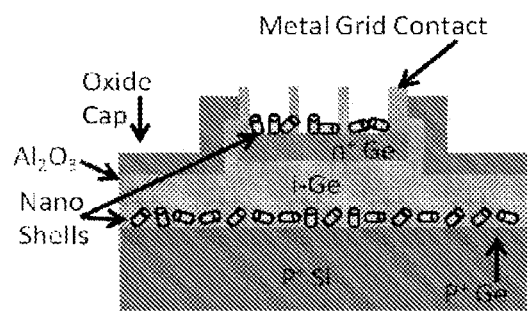
FIGS. 24A-C show detectors based on the nano-florets of the invention.
Figure 24B:
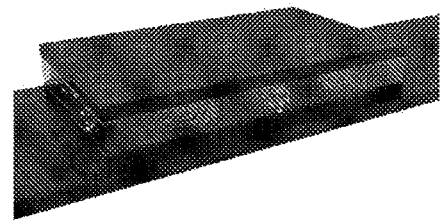
Figure 24C:
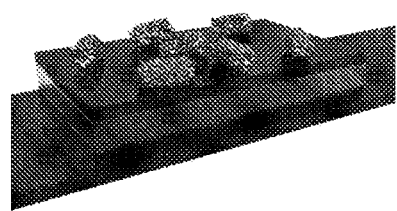

In FIG. 24 a detector which is based on the nanoshells of the invention is presented. FIG. 24A shows a typical Ge detector layer structure and the locations at which LSPR nanoshells absorbers are incorporated. Introducing the nanoshells in the middle of the PN active layer is most effective for sensitivity enhancement and spectral response broadening (FIG. 24B). This can be done by two steps of MOCVD polycrystalline Ge evaporation and adsorbing of the nano shells in between then ion implant the n contact. A simpler approach with lower quantum efficiency enhancement is achieved by adding the LSPR nanoshells absorbers on top of detector by using a grid top contact (FIG. 24C).

Figure 25:
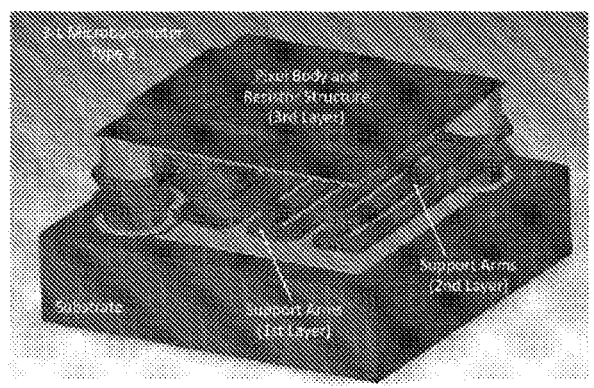
FIG. 25 presents a bolometer of the invention.

In FIG. 25 a bolometer which is based on the nanoshells of the invention is presented. Nanoshell LSPR absorbers are introduced on top of the bolometers absorbing layer. The nanoshells are introduced locally on pre-defined parts of the bolometer resistor. In this way the LSPR coupling will concentrate and enhance the response for 1-3 µm radiation to a specific part of the bolometer creating a hot spot. The hot spot will create a heat gate thus enhancing the response of the bolometer. It is estimated that the local heating could result in few oK/W at the relevant wavelength, which is significantly above the resolution threshold of the bolometer thus increasing the overall responsivity of the detector. Because bolometers design is resistive device with resistance in series, high increase of resistance in one part yields overall pixel response.

The invention claimed is:

1. A process for patterning a nanostructure consisting of a first metal and a semiconductor material with an oxide layer on the semiconductor material, said patterning being at a metal-semiconductor junction of the first metal and the semiconductor material, wherein the first metal is in direct contact with a surface of the semiconductor material, and wherein a portion of the semi-conductor material with the oxide layer thereon is at a region of the nanostructure at a vicinity of the junction, the process comprising:
contacting said nanostructure in solution with a processing solution comprising at least one etchant, at least one reducing agent and at least one metal source of a second metal, wherein said contacting of said nanostructure in solution with the processing solution comprises immersing the nanostructure in the processing solution; and
said contacting of the nanostructure causing self-processing involving selective etching of the oxide layer solely at said region at the vicinity of the junction to form an oxide-free region and selective deposition of at least one second metal from said at least one metal source of the second metal selectively at said oxide-free region, wherein the selective etching and said surface deposition of the second metal are confined to the region at the vicinity of the junction by self-limiting reactions such that the process provides the nanostructure to have growth of the second metal confined to the region at the vicinity of the junction.

2. The process according to claim 1, wherein first metal of the metal-semiconductor junction is Au and the second metal grown onto or at the vicinity of the junction is Cu, Au or Ag.

3. The process according to claim 1, wherein the contacting of said nanostructure in solution with the processing solution consists of the immersing of the nanostructure in the processing solution.

4. The process according to claim 1, wherein the metal of the metal-semiconductor junction is Au and the metal grown onto or at the vicinity of the junction is Au.

5. The process according to claim 1, wherein the metal of the metal-semiconductor junction is Au and the metal grown onto or at the vicinity of the junction is Ag.

6. The process according to claim 1, wherein the semiconductor material is a surface region or bulk material of a three-dimensional object.

7. The process according to claim 6, wherein the three-dimensional object is a feature of an electronic or optoelectronic device.

8. The process according to claim 7, wherein the object is a semiconductor nanowire.

9. The process according to claim 1, wherein the nanostructure comprises the metal-semiconductor junction on a substrate comprising the semiconductor and the processing solution contacts the junction and the substrate.

10. A process for forming a metal region at a metal-semiconductor junction of a nanostructure, the nanostructure consisting of a semiconductor material and at least one first metal with an oxide layer on the semiconductor material, wherein a surface of the semiconductor material is decorated with the at least one first metal, wherein the first metal is in direct contact with the surface of the semiconductor material, and wherein a portion of the semi-conductor material with the oxide layer thereon is at a region of the nanostructure at a vicinity of the junction, the process comprising:
  contacting the nanostructure in solution with a processing solution comprising:
    at least one metal source of a second metal,
    at least one reducing agent and
    at least one etchant,
  wherein said contacting of said nanostructure in solution with the processing solution comprises immersing the nanostructure in the processing solution, said contacting causing selective etching of an oxide layer present on the semiconductor surface of said nanostructure solely at the vicinity of the first metal to form an etched region,
  subsequent reduction of the at least one metal source of the second metal to at least one second metal and surface deposition of the at least one second metal at the etched region,
  wherein the selective etching and the surface deposition of the second metal are confined to the region at the vicinity of the junction by self-limiting reactions such that the process provides the nanostructure to have growth of the second metal confined to the region at the vicinity of the junction.

11. A process for patterning a nanostructure consisting of a first metal and a semiconductor material with an oxide layer on the semiconductor material, said patterning being at a metal-semiconductor junction of the first metal and the semiconductor material, wherein the first metal is in direct contact with a surface of the semiconductor material, and wherein a portion of the semi-conductor material with the oxide layer thereon is at a region of the nanostructure at a vicinity of the junction,
  the process consisting of:
  contacting said nanostructure in solution with a processing solution comprising:
    at least one etchant,
    at least one reducing agent and
    at least one metal source of a second metal,
  wherein said contacting of said nanostructure in solution with the processing solution is by immersing the nanostructure in the processing solution; said contacting of the nanostructure causing self-processing involving selective etching of the oxide layer at said region solely at a vicinity of the junction to form an oxide-free region and selective deposition of at least one second metal from said at least one metal source of the second metal selectively at said oxide-free region,
  wherein the selective etching and said surface deposition of the second metal are confined to the region at the vicinity of the junction by self-limiting reactions.

* * * * *